(12) United States Patent
Dautenhahn

(10) Patent No.: US 12,356,555 B2
(45) Date of Patent: Jul. 8, 2025

(54) SYSTEM AND METHOD FOR CONTROLLING FLOW OF SOLDER IN A WAVE SOLDERING MACHINE

(71) Applicant: Illinois Tool Works Inc., Glenview, IL (US)

(72) Inventor: Jonathan M. Dautenhahn, Lake Ozark, MO (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 18/424,194

(22) Filed: Jan. 26, 2024

(65) Prior Publication Data

US 2025/0133664 A1    Apr. 24, 2025

Related U.S. Application Data

(63) Continuation of application No. 18/381,350, filed on Oct. 18, 2023.

(51) Int. Cl.
*B23K 3/00* (2006.01)
*B23K 1/20* (2006.01)
(Continued)

(52) U.S. Cl.
CPC ........... *H05K 3/3468* (2013.01); *B23K 1/203* (2013.01); *B23K 3/0607* (2013.01);
(Continued)

(58) Field of Classification Search
CPC ............... H05K 3/3468; H05K 13/027; H05K 13/0815; H05K 2203/111;
(Continued)

(56) References Cited

U.S. PATENT DOCUMENTS 4,447,001 A * 5/1984 Allen ................... B23K 3/0653
228/37
4,712,719 A * 12/1987 Derrico ................. B23K 1/015
228/180.1
(Continued)

FOREIGN PATENT DOCUMENTS

CN        102485394 A      6/2012
CN        104249208 A  * 12/2014  ........... B23K 3/0653
(Continued)

*Primary Examiner* — Kiley S Stoner
(74) *Attorney, Agent, or Firm* — Lando & Anastasi, LLP

(57) ABSTRACT

A wave soldering machine is configured to perform a wave soldering operation on a printed circuit board. The wave soldering machine includes a housing and a conveyor coupled to the housing. The conveyor is configured to deliver a printed circuit board through the housing. The wave soldering machine further includes a wave soldering station coupled to the housing. The wave soldering station includes a solder pot having a reservoir of solder material, a flow duct positioned in the reservoir of the solder pot, and a wave soldering nozzle assembly coupled to the flow duct. The wave soldering nozzle assembly has a solder distribution baffle configured to create a solder wave. The wave soldering nozzle assembly is configured to control a width of the solder wave through the solder distribution baffle to produce a maximum width solder wave and a minimum width solder wave.

17 Claims, 21 Drawing Sheets

(51) Int. Cl.
*B23K 3/06* (2006.01)
*H05K 3/34* (2006.01)
*H05K 13/02* (2006.01)
*H05K 13/08* (2006.01)

(52) U.S. Cl.
CPC ......... *B23K 3/0653* (2013.01); *H05K 13/027* (2013.01); *H05K 13/0815* (2018.08); *H05K 2203/111* (2013.01); *H05K 2203/1509* (2013.01)

(58) Field of Classification Search
CPC .. H05K 2203/1509; H05K 3/34; B23K 1/203; B23K 3/0607; B23K 3/0653; B23K 1/085
USPC ............................ 228/33, 37, 43, 256, 260
See application file for complete search history.

(56) References Cited

U.S. PATENT DOCUMENTS

| | | | | |
|---|---|---|---|---|
| 4,886,201 A | * | 12/1989 | Deambrosio | B23K 3/0653 228/37 |
| 5,156,324 A | * | 10/1992 | Hueste | B23K 1/085 228/180.1 |
| 6,732,903 B2 | * | 5/2004 | Wang | B23K 3/0653 228/37 |
| 11,389,888 B2 | * | 7/2022 | Dautenhahn | B23K 1/0016 |
| 2016/0052074 A1 | * | 2/2016 | Hueste | H05K 3/3489 228/37 |
| 2018/0111211 A1 | * | 4/2018 | Dautenhahn | H05K 3/34 |
| 2019/0381590 A1 | * | 12/2019 | Dautenhahn | B23K 1/085 |
| 2022/0048127 A1 | * | 2/2022 | Dautenhahn | B23K 1/0016 |

FOREIGN PATENT DOCUMENTS

| | | | | |
|---|---|---|---|---|
| CN | 104684273 A | * | 6/2015 | |
| CN | 104999149 A | | 10/2015 | |
| CN | 105397233 A | * | 3/2016 | |
| CN | 106925857 A | * | 7/2017 | ............ B23K 1/085 |
| CN | 106975816 A | * | 7/2017 | |
| CN | 110385499 A | * | 10/2019 | .......... B23K 3/0607 |
| CN | 113857614 A | * | 12/2021 | |
| DE | 3309839 A1 | | 10/1983 | |
| DE | 4314241 C2 | | 12/1999 | |
| EP | 0278166 A2 | * | 8/1988 | |
| EP | 2928634 B1 | * | 2/2018 | .......... B23K 1/0016 |
| EP | 3437775 A1 | * | 2/2019 | .......... B23K 1/0016 |
| JP | 62024858 A | * | 2/1987 | |
| JP | 06000633 A | * | 1/1994 | |
| JP | H09283912 A | * | 10/1997 | |
| JP | H1154902 A | * | 2/1999 | |
| JP | H1174639 A | * | 3/1999 | |
| JP | 2001251047 A | * | 9/2001 | ............ B23K 1/085 |
| JP | 2002192340 A | | 7/2002 | |
| JP | 2006080439 A | | 3/2006 | |
| JP | 5910784 B1 | * | 4/2016 | .......... B23K 1/0016 |
| JP | 6852710 B2 | | 3/2021 | |
| WO | WO-2015040691 A1 | * | 3/2015 | .......... B23K 3/0653 |
| WO | WO-2019131080 A1 | * | 7/2019 | .......... B23K 1/0016 |

* cited by examiner

SYSTEM AND METHOD FOR CONTROLLING FLOW OF SOLDER IN A WAVE SOLDERING MACHINE

BACKGROUND OF DISCLOSURE

1. Field of Disclosure

The present disclosure relates generally to apparatus and methods for manufacturing printed circuit boards and for assisting a process of soldering metals to integrated circuit boards, and more particularly to a wave soldering machine and related method having a wave solder nozzle assembly that is configured to control flow of solder.

2. Discussion of Related Art

In the fabrication of printed circuit boards, electronic components can be mounted to a printed circuit board by a process known as "wave soldering." In a typical wave solder machine, a printed circuit board (sometimes referred to as a "PCB") is moved by a conveyor on an inclined path past a fluxing station, a pre-heating station, and finally a wave soldering station. At the wave soldering station, a wave of solder is caused to well upwardly (by means of a pump) through a wave solder nozzle and contact portions of the printed circuit board to be soldered.

Typical wave solder nozzles have nozzles configured to control the flow of solder generated by the wave soldering machine. The process of adjusting the solder flow can be difficult and imposes risks to operators tasked with making such adjustments within a solder pot filled with molten solder. Minimizing dross created by the solder flow over the nozzle is also desired.

SUMMARY OF DISCLOSURE

One aspect of the present disclosure is directed to a wave soldering machine to perform a wave soldering operation on a printed circuit board. In one embodiment, the wave soldering machine comprises a housing and a conveyor coupled to the housing. The conveyor is configured to deliver a printed circuit board through the housing. The wave soldering machine further comprises a wave soldering station coupled to the housing. The wave soldering station includes a solder pot having a reservoir of solder material, a flow duct positioned in the reservoir of the solder pot, and a wave soldering nozzle assembly coupled to the flow duct. The wave soldering nozzle assembly has a solder distribution baffle configured to create a solder wave. The wave soldering nozzle assembly is configured to control a width of the solder wave through the solder distribution baffle to produce a maximum width solder wave and a minimum width solder wave.

Embodiments of the wave soldering machine further may include configuring the wave soldering nozzle assembly to include a core frame supported by the flow duct and configured to support the solder distribution baffle. The wave soldering nozzle assembly further may include at least two nozzle plates. Each nozzle plate may be configured to move with respect to the solder distribution baffle between an open position in which solder flows through the solder distribution baffle and the nozzle plate and a closed position in which solder is prohibited from flowing through the solder distribution baffle and the nozzle plate. The wave soldering nozzle assembly further may include, for each nozzle plate, an actuator configured to move the nozzle plate between the open position and the closed position. The wave soldering nozzle assembly further may include, for each nozzle plate, a link configured to secure the actuator to the nozzle plate. The actuator may be secured to the solder pot by an actuator support. The actuator may be coupled to a controller to control the movement of the actuator. The wave soldering nozzle assembly further may include four nozzle plates provided along a width of the solder distribution baffle. The solder distribution baffle and each nozzle plate each may include a pattern of openings to enable solder to pass through the solder distribution baffle and the nozzle plate.

The wave soldering nozzle assembly further may include at least two nozzle plates. Each nozzle plate may be configured to rotate with respect to the solder distribution baffle between an open position in which solder flows through the solder distribution baffle and the nozzle plate and a closed position in which solder is prohibited from flowing through the solder distribution baffle and the nozzle plate. The wave soldering nozzle assembly further may include, for each nozzle plate, an actuator configured to rotate the nozzle plate between the open position and the closed position. The wave soldering nozzle assembly further may include, for each nozzle plate, a link configured to secure the actuator to the nozzle plate and configured to rotate the nozzle plate between the open position and the closed position. The actuator may be coupled to a controller to control the movement of the actuator. The wave soldering nozzle assembly further may include three nozzle plates provided along a width of the solder distribution baffle. The solder distribution baffle includes a pattern of openings to enable solder to pass through the solder distribution baffle.

The wave soldering station further may include at least two pump impellers positioned within the reservoir the solder pot adjacent the flow duct. The flow duct may include at least two chambers. Each pump impeller may be in fluid communication with a respective chamber. The flow of solder within each chamber of the at least two chambers may be controlled by a respective pump impeller of the at least two pump impellers. Each pump impeller of the at least two pump impellers may include a centrifugal pump to pump the molten solder to the wave soldering nozzle assembly. The at least two pump impellers may include three pump impellers. The at least two chambers may include three chambers. Each chamber of the at least two chambers may include an inlet, which is connected to a respective pump impeller. Each pump impeller of the at least two pump impellers may be coupled to a controller to control the flow of solder provided by the pump impeller.

Another aspect of the present disclosure is directed to a wave soldering station of a wave soldering machine. The wave soldering station is configured to perform a wave soldering operation on a printed circuit board. In one embodiment, the wave soldering station comprises a solder pot having a reservoir of solder material, a flow duct positioned in the reservoir of the solder pot, and a wave soldering nozzle assembly coupled to the flow duct. The wave soldering nozzle assembly has a solder distribution baffle configured to create a solder wave. The wave soldering nozzle assembly is configured to control a width of the solder wave through the solder distribution baffle to produce a maximum width solder wave and a minimum width solder wave.

Embodiments of the wave soldering station further may include configuring the wave soldering nozzle assembly further to include a core frame supported by the flow duct and configured to support the solder distribution baffle. The wave soldering nozzle assembly further may include at least two nozzle plates. Each nozzle plate may be configured to move with respect to the solder distribution baffle between an open position in which solder flows through the solder distribution baffle and the nozzle plate and a closed position in which solder is prohibited from flowing through the solder distribution baffle and the nozzle plate. The wave soldering nozzle assembly further may include, for each nozzle plate, an actuator configured to move the nozzle plate between the open position and the closed position. The wave soldering nozzle assembly further may include, for each nozzle plate, a link configured to secure the actuator to the nozzle plate. The actuator may be secured to the solder pot by an actuator support. The actuator may be coupled to a controller to control the movement of the actuator. The wave soldering nozzle assembly further may include four nozzle plates provided along a width of the solder distribution baffle. The solder distribution baffle and each nozzle plate each may include a pattern of openings to enable solder to pass through the solder distribution baffle and the nozzle plate.

The wave soldering nozzle assembly further may include at least two nozzle plates. Each nozzle plate may be configured to rotate with respect to the solder distribution baffle between an open position in which solder flows through the solder distribution baffle and the nozzle plate and a closed position in which solder is prohibited from flowing through the solder distribution baffle and the nozzle plate. The wave soldering nozzle assembly further may include, for each nozzle plate, an actuator configured to rotate the nozzle plate between the open position and the closed position. The wave soldering nozzle assembly further may include, for each nozzle plate, a link configured to secure the actuator to the nozzle plate and configured to rotate the nozzle plate between the open position and the closed position. The actuator may be coupled to a controller to control the movement of the actuator. The wave soldering nozzle assembly further includes three nozzle plates provided along a width of the solder distribution baffle. The solder distribution baffle may include a pattern of openings to enable solder to pass through the solder distribution baffle.

The wave soldering station further may include at least two pump impellers positioned within the reservoir of the solder pot adjacent the flow duct. The flow duct may include at least two chambers. Each pump impeller may be in fluid communication with a respective chamber. The flow of solder within each chamber of the at least two chambers may be controlled by a respective pump impeller of the at least two pump impellers. Each pump impeller of the at least two pump impellers may include a centrifugal pump to pump the molten solder to the wave soldering nozzle assembly. The at least two pump impellers may include three pump impellers. The at least two chambers may include three chambers. Each chamber of the at least two chambers may include an inlet, which is connected to a respective pump impeller. Each pump impeller of the at least two pump impellers may be coupled to a controller to control the flow of solder provided by the pump impeller.

Yet another aspect of the present disclosure is directed to a method of adjusting a width of a solder wave of a wave soldering nozzle assembly of a wave soldering machine. In one embodiment, the method comprises: delivering solder material to a wave soldering nozzle assembly including a solder distribution baffle; adjusting a width of a solder wave with the wave soldering nozzle assembly by selectively delivering solder to portions of the solder distribution baffle; and performing a wave soldering operation on a printed circuit board.

Embodiments of the method further may include adjusting a width of the solder wave by moving a nozzle plate of at least two nozzle plates. Each nozzle plate may be configured to move with respect to the solder distribution baffle between an open position in which solder flows through the solder distribution baffle and the nozzle plate and a closed position in which solder is prohibited from flowing through the solder distribution baffle and the nozzle plate. The wave soldering nozzle assembly further may include, for each nozzle plate, an actuator configured to move the nozzle plate between the open position and the closed position. The method further may include controlling the actuator with a controller.

Adjusting a width of the solder wave may be achieved by rotating a nozzle plate of at least two nozzle plates. Each nozzle plate may be configured to rotate with respect to the solder distribution baffle between an open position in which solder flows through the solder distribution baffle and the nozzle plate and a closed position in which solder is prohibited from flowing through the solder distribution baffle and the nozzle plate. The wave soldering nozzle assembly further may include, for each nozzle plate, an actuator configured to rotate the nozzle plate between the open position and the closed position. The method further may include controlling the actuator with a controller.

Adjusting a width of the solder wave may be achieved by selectively controlling at least two pump impellers positioned within a reservoir a solder pot of the wave soldering station. The wave soldering station may include a flow duct having at least two chambers. Each pump impeller may be in fluid communication with a respective chamber. The flow of solder within each chamber of the at least two chambers may be controlled by a respective pump impeller of the at least two pump impellers. Each pump impeller of the at least two pump impellers may include a centrifugal pump to pump the molten solder to the wave soldering nozzle assembly. The at least two pump impellers may include three pump impellers. The at least two chambers may include three chambers. Each chamber of the at least two chambers may include an inlet, which is connected to a respective pump impeller. The method further may include controlling each pump impeller of the at least two pump impellers with a controller.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
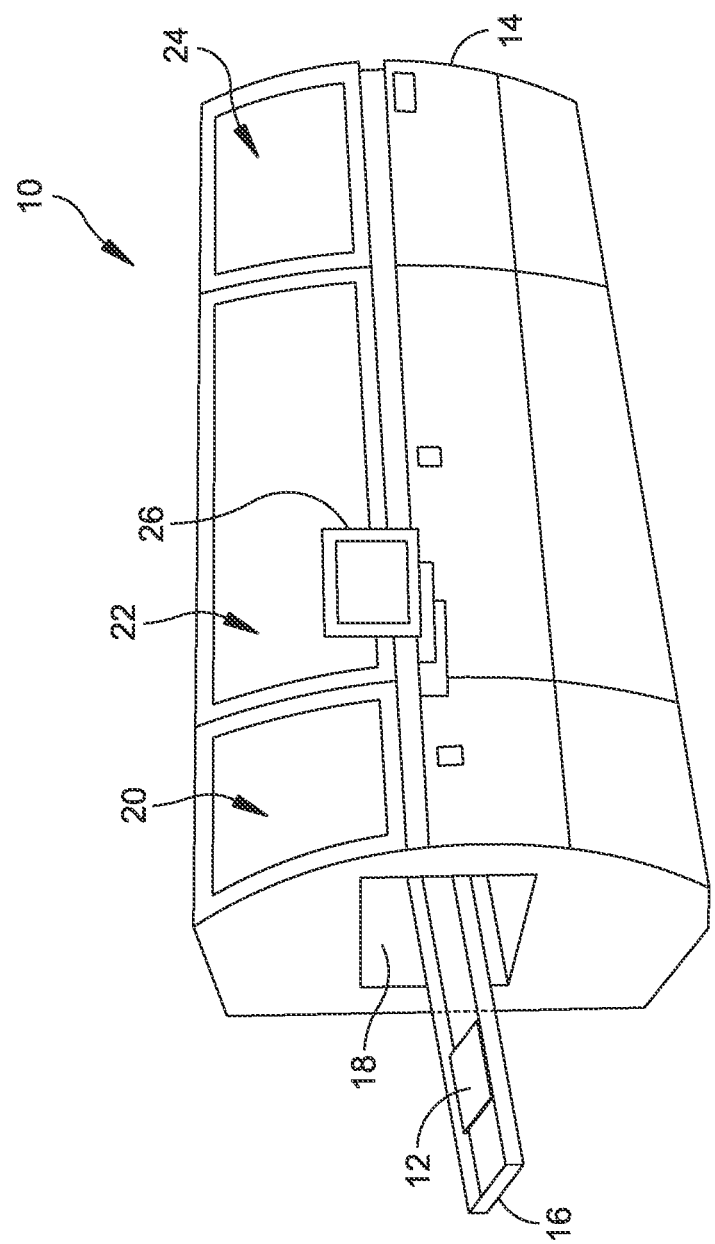
FIG. 1 is a perspective view of a wave soldering machine.

This disclosure is not limited in its application to the details of construction and the arrangement of components set forth in the following description or illustrated in the drawings. The disclosure is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Embodiments of the present disclosure are directed to controlling the flow of molten solder over a nozzle in order to vary a width of the solder wave. One objective is to provide the ability to adjust (reduce) a width of the solder wave to reduce dross produced by the solder wave. An additional objective is to automate this adjustment and allow for computer control to eliminate the need for human intervention when adjustment is needed based on the product being processed.

For purposes of illustration, and with reference to FIG. 1, embodiments of the present disclosure will now be described with reference to a wave soldering machine, generally indicated at 10, which is used to perform a solder application on a printed circuit board 12. The wave soldering machine 10 is one of several machines in a printed circuit board fabrication/assembly line. As shown, the wave soldering machine 10 includes a housing or frame 14 adapted to house the components of the machine. The arrangement is such that a conveyor 16 delivers printed circuit boards to be processed by the wave soldering machine 10. Upon entering the wave soldering machine 10, each printed circuit board 12 travels along an inclined path (e.g., six degrees with respect to horizontal) along the conveyor 16 through a tunnel 18, which includes a fluxing station, generally indicated at 20, and a pre-heating station, generally indicated at 22, to condition the printed circuit board for wave soldering. Once conditioned (i.e., heated), the printed circuit board 12 travels to a wave soldering station, generally indicated at 24, to apply solder material to the printed circuit board. A controller 26 is provided to automate the operation of the several stations of the wave soldering machine 10, including but not limited to the fluxing station 20, the pre-heating station 22, and the wave soldering station 24, in the well-known manner.

Figure 2:
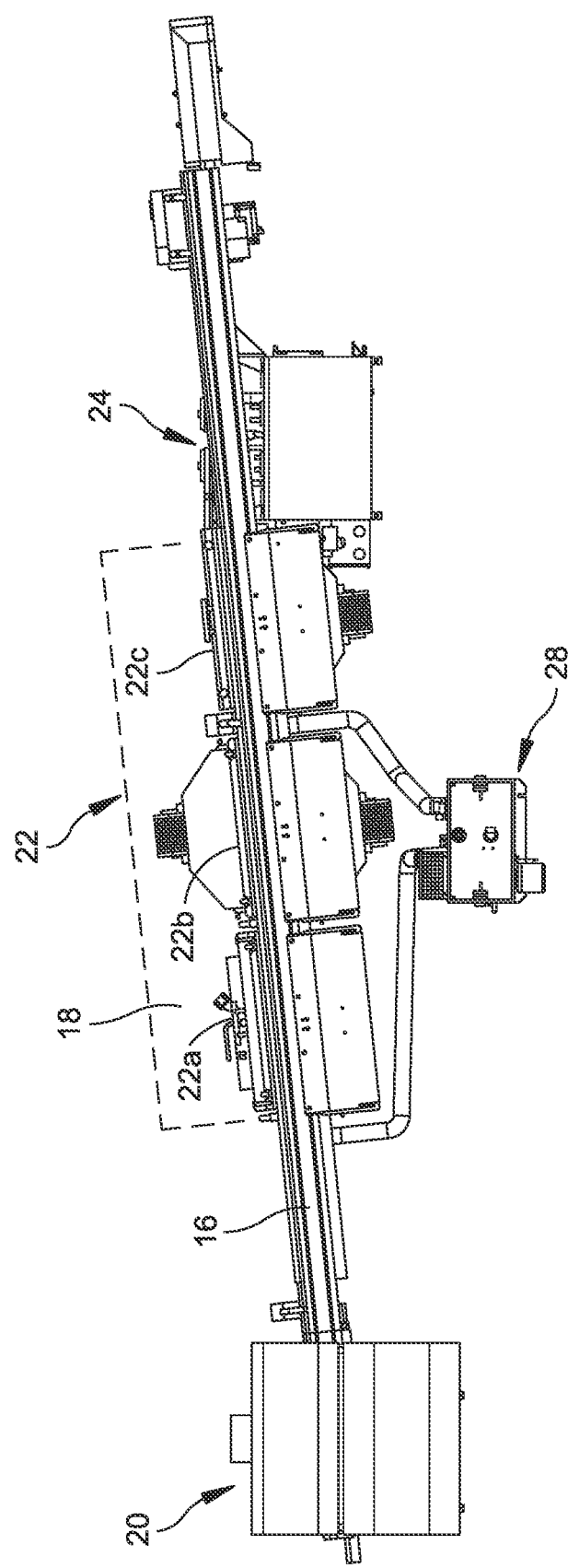
FIG. 2 is a side elevational view of the wave soldering machine with external packaging removed to reveal internal components of the wave soldering machine.

Referring to FIG. 2, the fluxing station 20 is configured to apply flux to the printed circuit board as it travels on the conveyor 16 through the wave soldering machine 10. The pre-heating station includes several pre-heaters (e.g., pre-heaters 22a, 22b and 22c), which are designed to incrementally increase the temperature of the printed circuit board as it travels along the conveyor 16 through the tunnel 18 to prepare the printed circuit board for the wave soldering process. As shown and described in greater detail below, the wave soldering station 24 includes a wave solder nozzle assembly in fluid communication with a reservoir of solder material. A pump is provided within the reservoir to deliver molten solder material to the wave soldering nozzle assembly from the reservoir. Once soldered, the printed circuit board exits the wave soldering machine 10 via the conveyor 16 to another station provided in the fabrication line, e.g., a pick-and-place machine.

In some embodiments, the wave soldering machine 10 further may include a flux management system, generally indicated at 28, to remove volatile contaminants from the tunnel 18 of the wave soldering machine. As shown in FIG. 2, the flux management system 28 is positioned below the pre-heating station 22. In one embodiment, the flux management system is supported by the housing 14 within the wave soldering machine, and is in fluid communication with the tunnel 18, which is schematically illustrated in FIG. 2. The flux management system 28 is configured to receive contaminated gas from the tunnel 18, treat the gas, and return clean gas back to the tunnel. The flux management system 28 is particularly configured to remove volatile contaminants from the gas, especially in inert atmospheres.

Embodiments of the present disclosure are directed to minimizing dross associated with the molten solder. Different combinations of tin, lead and other metals are used to create lead-based and lead-free solders. Dross is a mass of solid impurities floating on the surface of the molten solder or dispersed within the molten solder. For solder, dross has a tendency to form on the surface of the tin-based molten metal, with oxidized impurities creating the dross.

Sliding Solder Nozzle Plate Design

Figure 3:
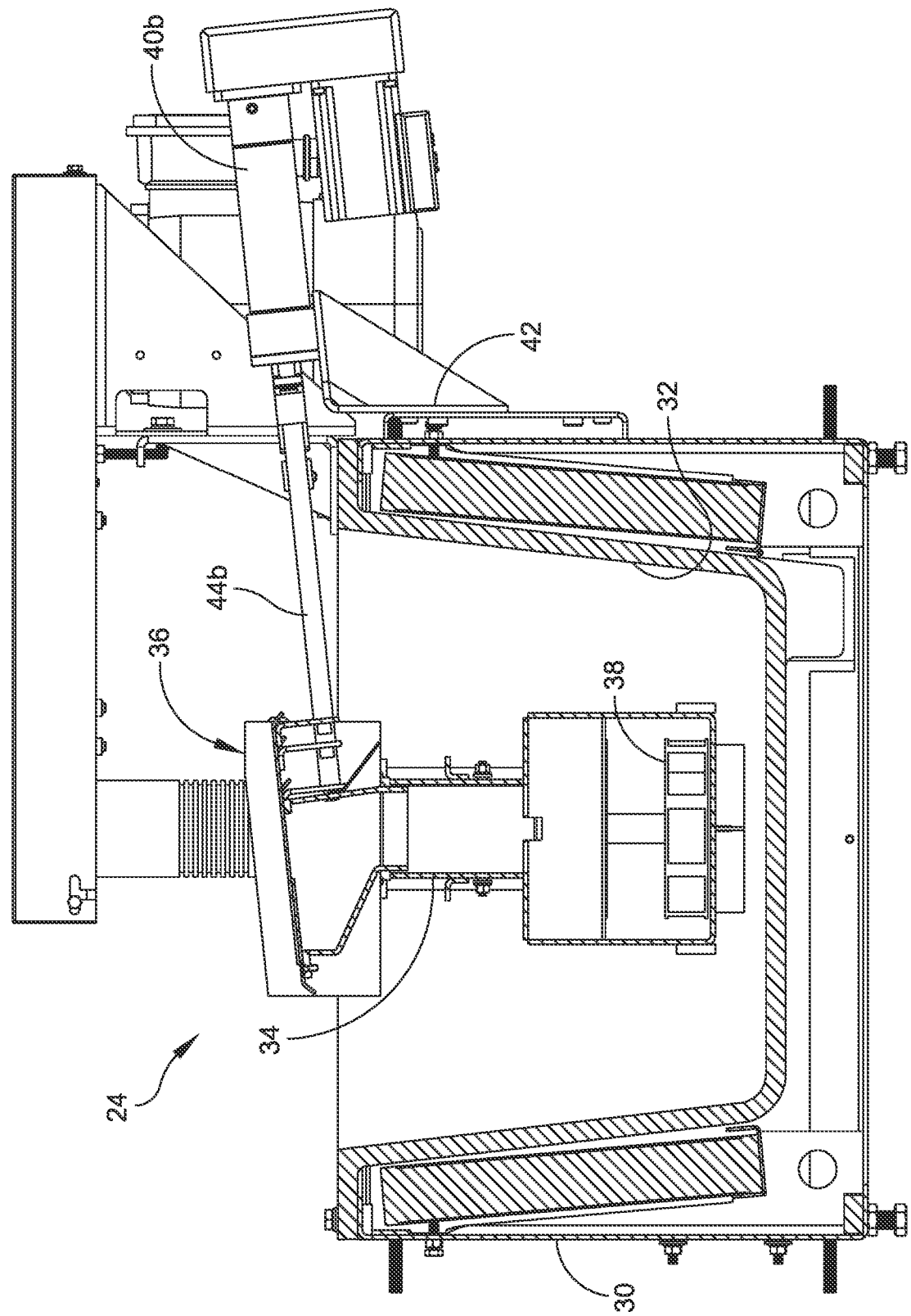
FIG. 3 is a cross-sectional view of a wave soldering station of an embodiment of the present disclosure.
Figure 4:
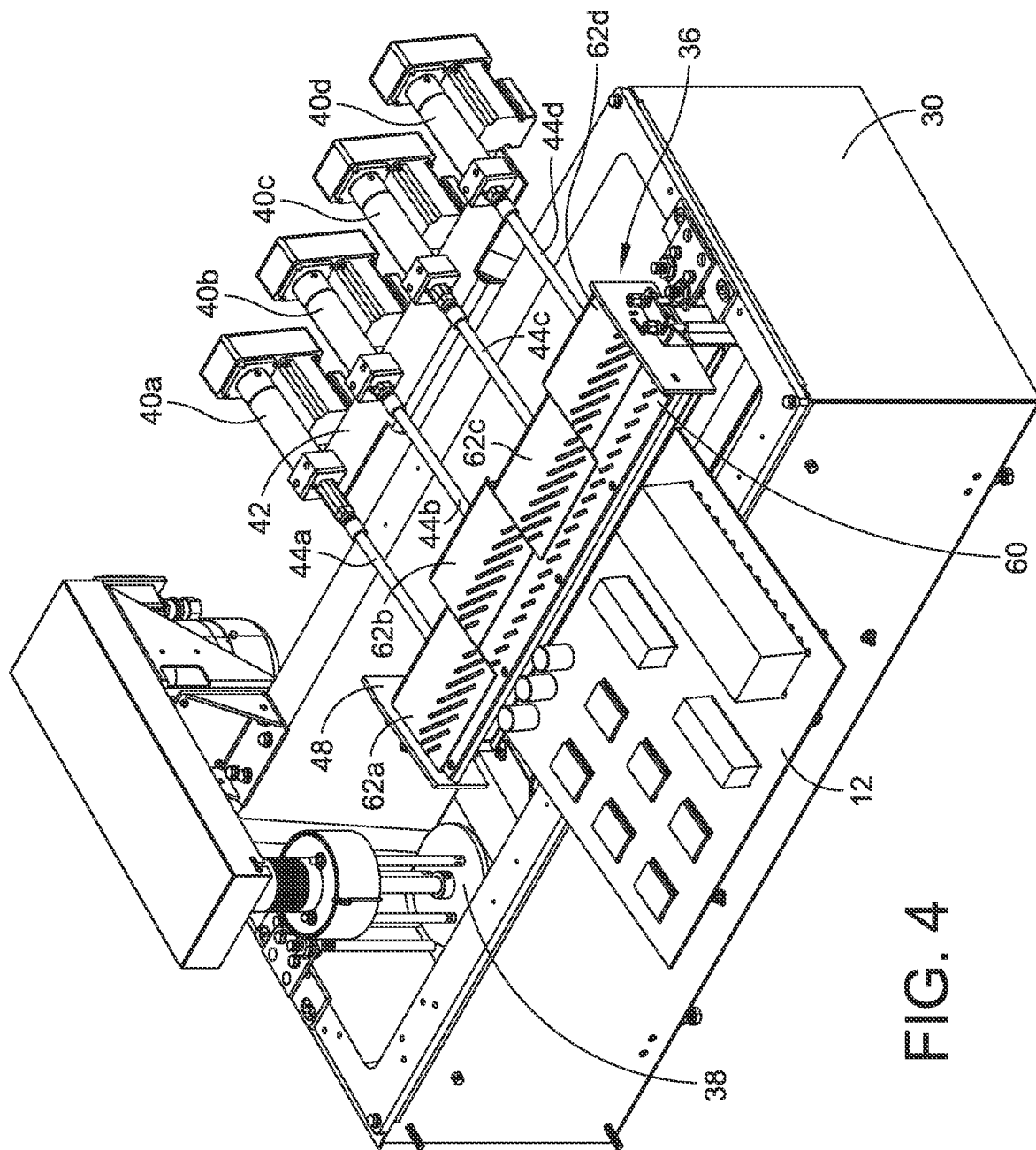
FIG. 4 is a perspective view of the wave soldering station showing a printed circuit board disposed adjacent to the wave soldering station.

Referring to FIGS. 3 and 4, in one embodiment, the wave soldering station 24 includes a solder pot 30 that defines a reservoir 32 configured to contain molten solder. In one embodiment, the solder pot 30 is a box-shaped structure that supports the components of the wave soldering station 24 including a flow duct 34 having one or more chambers within the reservoir 32. The flow duct 34 is designed to deliver pressurized molten solder to an opening or nozzle of a wave soldering nozzle assembly, which is generally indicated at 36. As will be described in greater detail below, the wave soldering nozzle assembly 36 is configured to channel the molten solder to the bottom of the printed circuit board 12 and provides for smooth flow of solder back into the reservoir 32. Specifically, the wave soldering nozzle assembly 36 is capable of adjusting a height and a width of the solder wave when performing a wave soldering operation.

The wave soldering station 24 further includes a pump impeller 38 positioned within the reservoir 32 of the solder pot 30 adjacent an inlet provided in the flow duct 34. The pump impeller 38 pressurizes the molten solder in the reservoir 32 to pump the molten solder vertically within the reservoir to the wave soldering nozzle assembly 36. In one embodiment, the pump impeller 38 is a centrifugal pump that is suitably sized to pump the molten solder to the nozzle of the wave soldering nozzle assembly 36. The wave soldering nozzle assembly 36 is configured to generate a solder wave that is provided to attach components on the circuit board 12 in the manner described herein, and to optimize a dwell time during processing.

Figure 5:
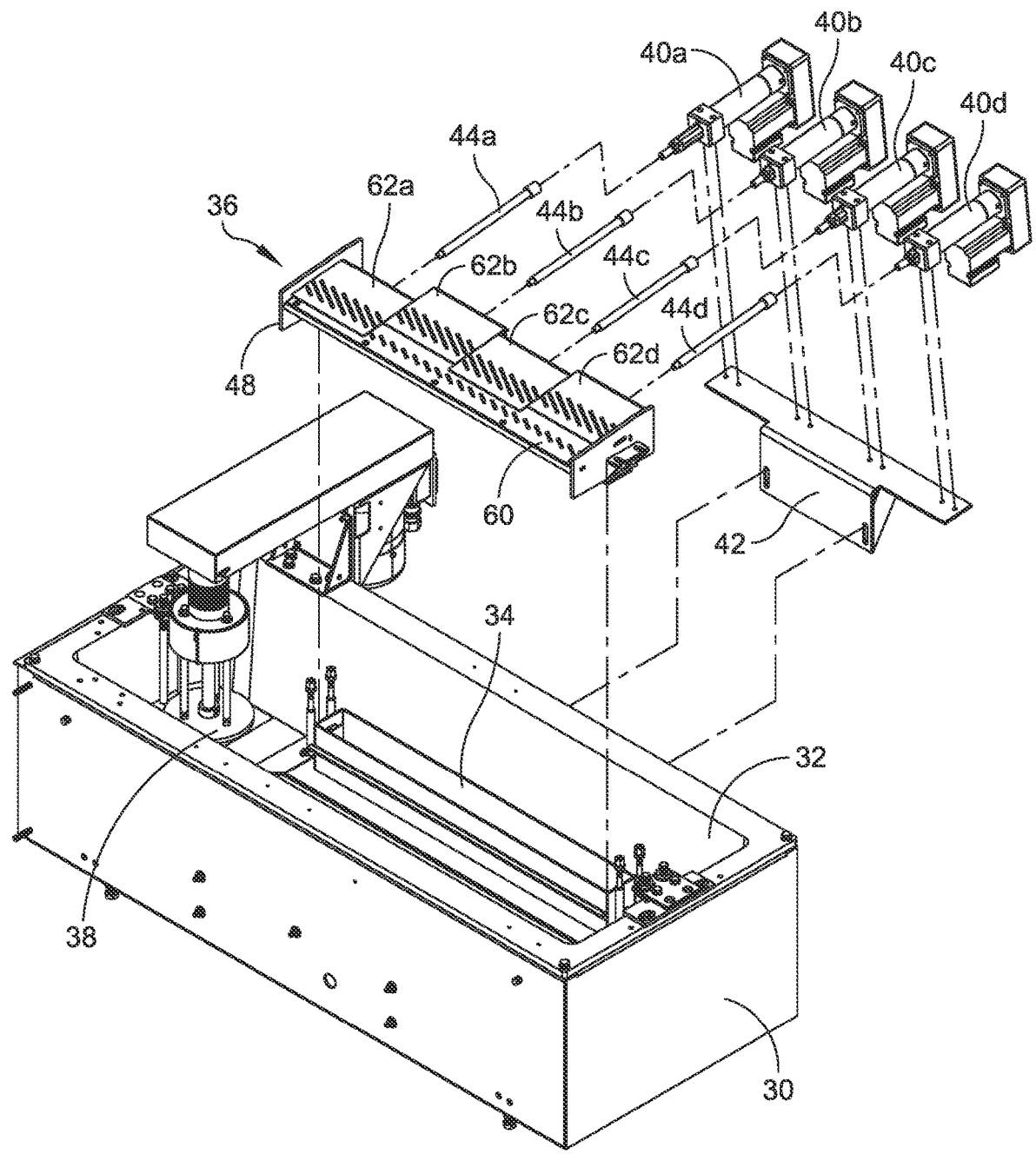
FIG. 5 is an exploded perspective view of the wave soldering station.
Figure 6:
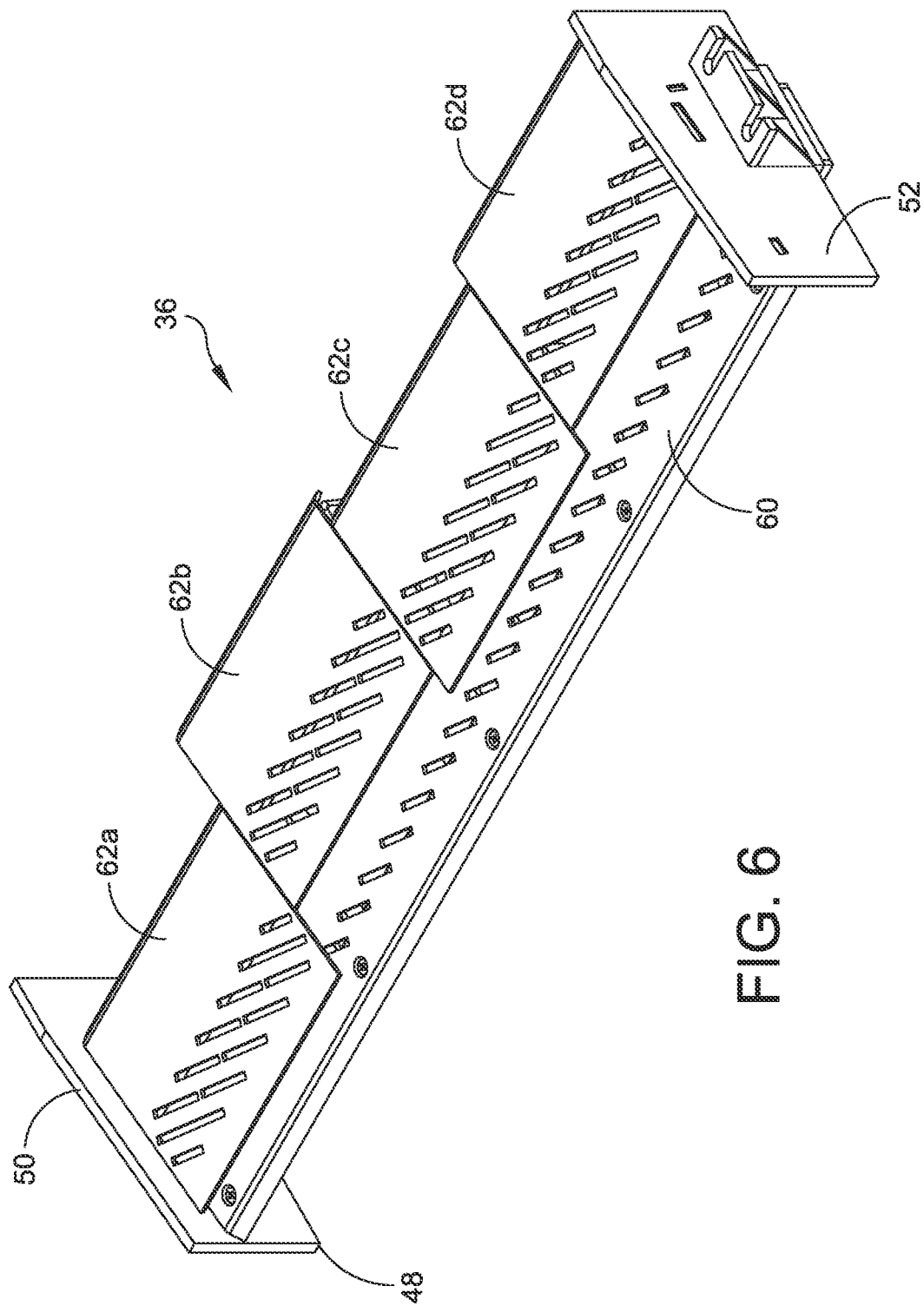
FIG. 6 is a perspective view of a wave soldering nozzle assembly of the wave soldering station.

Referring additionally to FIGS. 5 and 6, the wave soldering nozzle assembly 36 is coupled to four actuators, actuators 40a, 40b, 40c, 40d, to variably adjust widths of the solder wave during a wave soldering operation to increase or decrease a contact length of the solder wave. The actuators 40a, 40b, 40c, 40d are secured to the solder pot 30 by an actuator support frame 42, which is secured to a side wall of the solder pot by suitable fasteners, such as bolts. The actuator support frame 42 could alternately be secured to the solder pot 30 by another method, such as welding. As shown, the actuators 40a, 40b, 40c, 40d are secured to the actuator support frame 42, which is configured to support the actuators firmly relative to the solder pot 30. The actuators 40a, 40b, 40c, 40d are positioned next to the wave soldering nozzle assembly 36 and form part of the assembly to adjust the nozzle of the wave soldering nozzle assembly by respective connecting links 44a, 44b, 44c, 44d, which are coupled to their respective actuators thereby providing movement to variable adjustment of a nozzle opening width of the wave soldering nozzle assembly. In certain embodiments, each actuator 40a, 40b, 40c, 40d includes an electromechanical actuator that provides movement for the adjustment of the nozzle opening width. The actuators 40a, 40b, 40c, 40d are driven by computer controlled machine software (supported by the controller 26) and incorporate an encoder that can relay position indication to the machine software.

Figure 7:
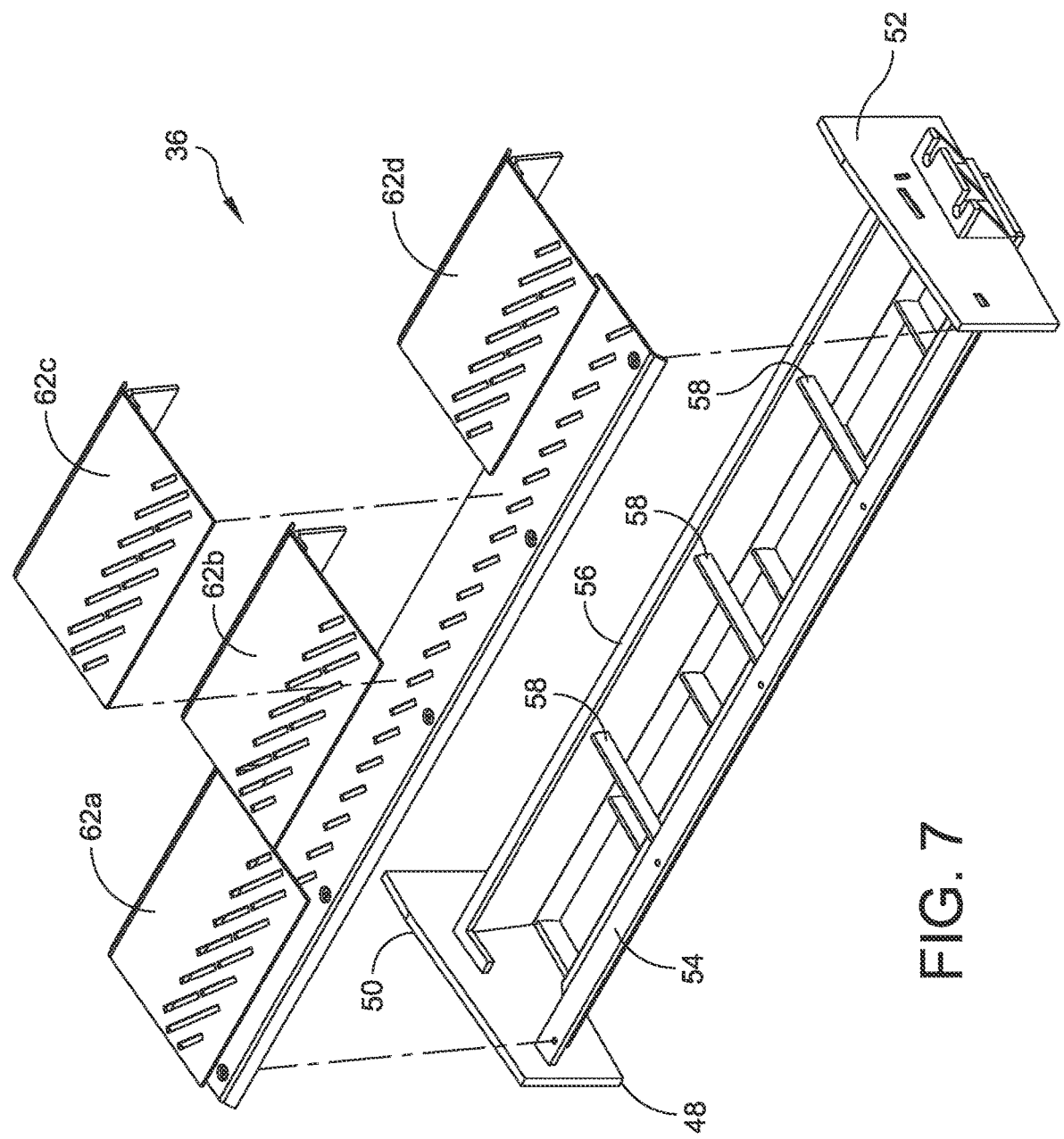
FIG. 7 is an exploded perspective view of the wave soldering nozzle assembly.
Figure 8:
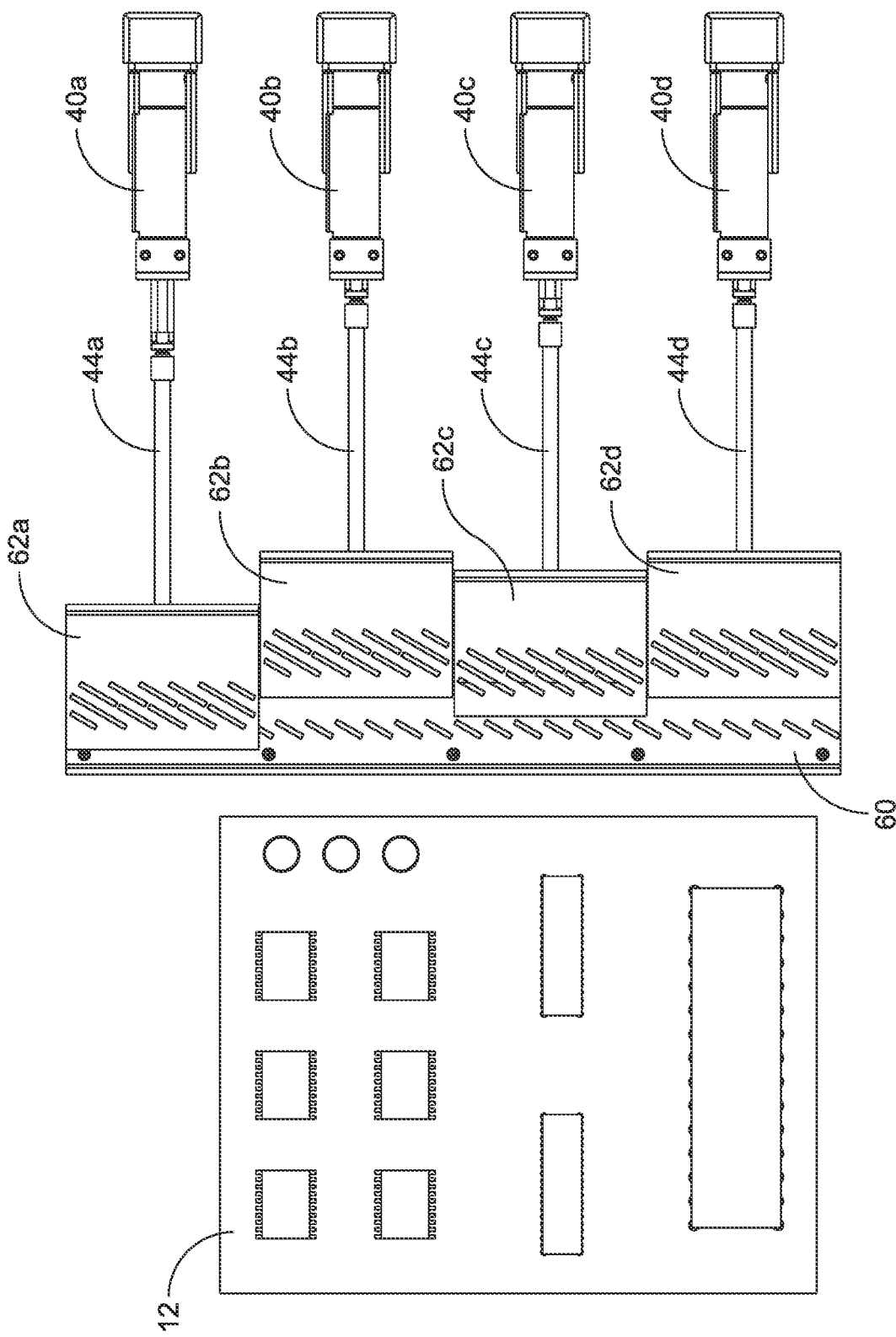
FIG. 8 is a top plan view of the wave soldering nozzle assembly showing a printed circuit board disposed adjacent to the wave soldering nozzle assembly.

Referring to FIGS. 7 and 8, the wave soldering nozzle assembly 36 includes a nozzle core frame 48 having two end walls 50, 52, a first longitudinal support element 54 and a second longitudinal support element 56 that extends between the end walls. As shown, the nozzle core frame 48 further may include several cross support elements, each indicated at 58, that extend between the first longitudinal support element 54 and the second longitudinal support element 56. The nozzle core frame 48 also directs the solder flow through a nozzle throat defined between the first and second longitudinal support elements 54, 56. The wave soldering nozzle assembly 36 further includes an elongate solder distribution baffle 60 that is secured to the first longitudinal support element 54 of the nozzle core frame 48. The solder distribution baffle 60 is secured to the first longitudinal support element 54 with screws, e.g., through five openings located at the load side of the baffle. In one embodiment, one side, i.e., the load side 64, of the solder distribution baffle 60 is secured to or formed integrally with the first longitudinal support element 54, and the other side, i.e., the unload side 66, of the solder distribution baffle is secured to or integrally formed with the second longitudinal support element 56. In one embodiment, the solder distribution baffle 60 includes a unique pattern of elongate openings to enable molten solder to flow through the baffle.

The wave soldering nozzle assembly 36 further includes four solder nozzle plates 62a, 62b, 62c, 62d, which are secured to respective links 44a, 44b, 44c, 44d and a moved by respective actuators 40a, 40b, 40c, 40d. Each solder nozzle plate 62a, 62b, 62c, 62d includes the same unique pattern of elongate openings. The unique hole pattern design incorporated into the solder distribution baffle and the solder nozzle plates produces an even, parallel wave across the entire solder contact area while maintaining a six-degree liquid, molten solder plane that is parallel with the six-degree plane of the conveyor 16 conveying the circuit board 12. As shown, each solder nozzle plate 62a, 62b, 62c, 62d is moved by its respective actuator 40a, 40b, 40c, 40d to control the flow of molten solder through the solder distribution baffle 60 and the solder distribution baffles.

In some embodiments, the wave soldering nozzle assembly 36 further includes a dross box that is secured to the nozzle frame and configured to reduce turbulence as the solder travels back to the reservoir 32, thereby reducing solder balls that can form within the reservoir. One or more nitrogen tubes can be provided to create an inert atmosphere during the wave soldering process.

Figure 9:
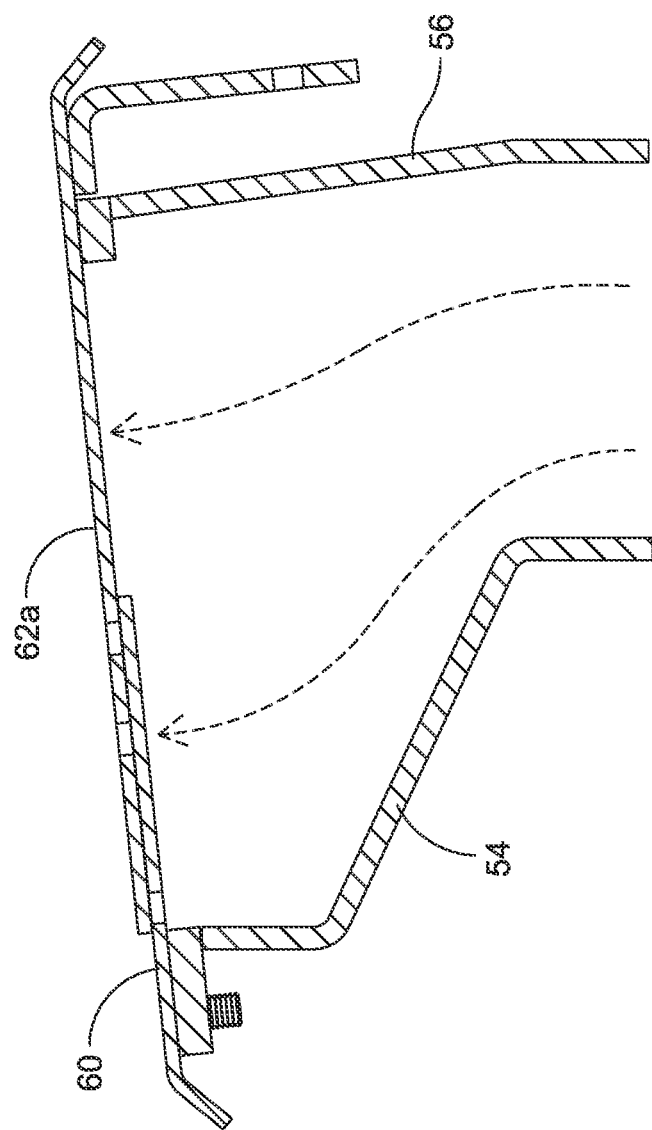
FIG. 9 is a cross-sectional view of a portion of the wave soldering nozzle assembly showing a plate of the wave soldering nozzle assembly in a closed position.

FIG. 9 illustrates a solder nozzle plate, e.g., solder nozzle plate 62a, in a fully extended position so that the solder nozzle plate nearly completely overlaps the solder distribution baffle 60 to prohibit flow of molten solder through the nozzle. As shown, the flow of molten solder is prevented from passing through the solder distribution baffle 60.

Figure 10:
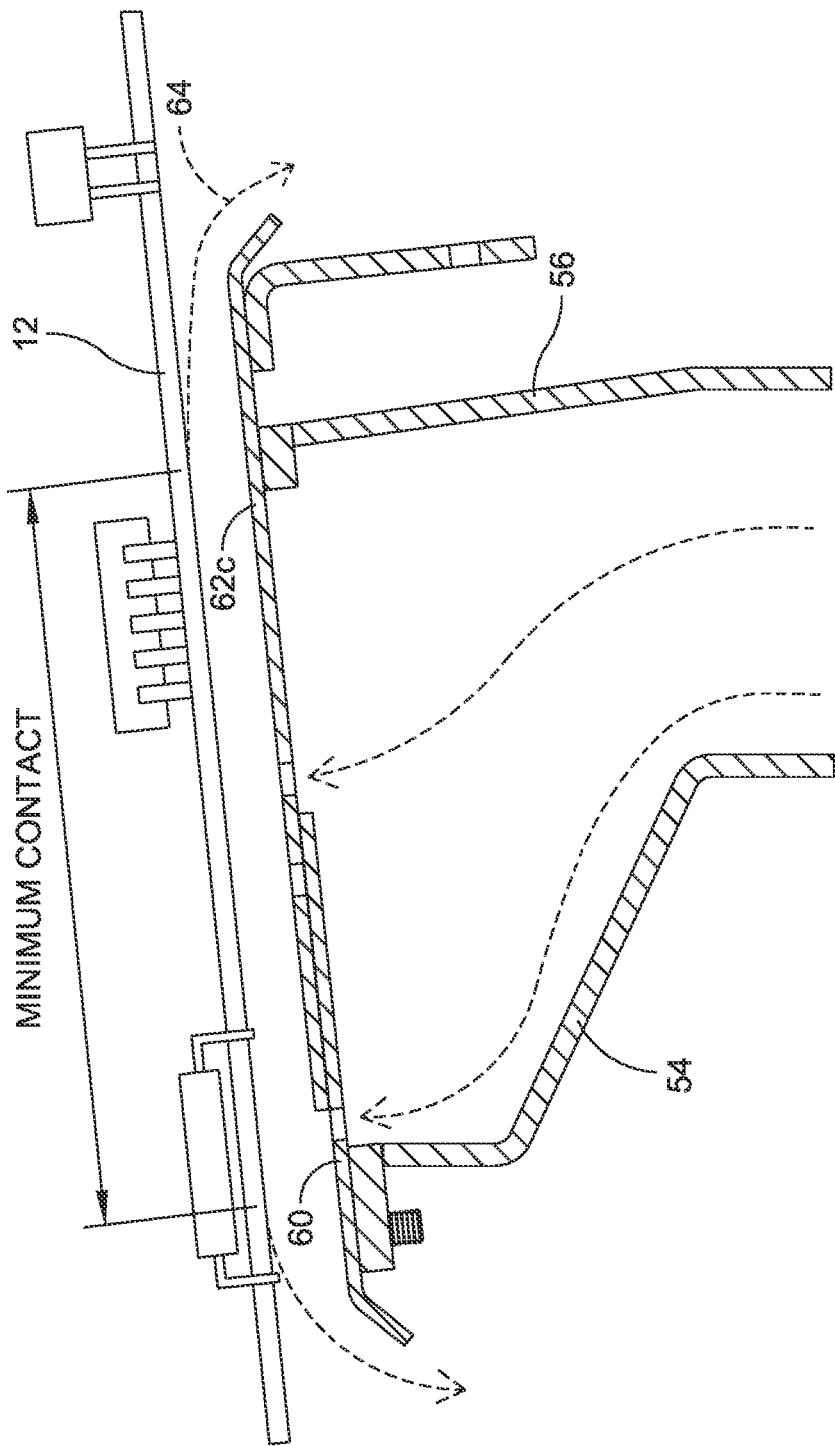
FIG. 10 is a cross-sectional view of the portion of the wave soldering nozzle assembly showing the plate of the wave soldering nozzle assembly in a partial open position.

FIG. 10 illustrates a solder nozzle plate, e.g., solder nozzle plate 62c, in a first partially extended position so that the solder nozzle plate partially overlaps the solder distribution baffle 60 to partially allow flow of molten solder through the nozzle. As shown, the flow of molten solder is capable of partially passing through the solder distribution baffle 60 and the solder nozzle plate 62c. The printed circuit board 12 passing over a solder wave 64 has minimum contact with the solder wave 64.

Figure 11:
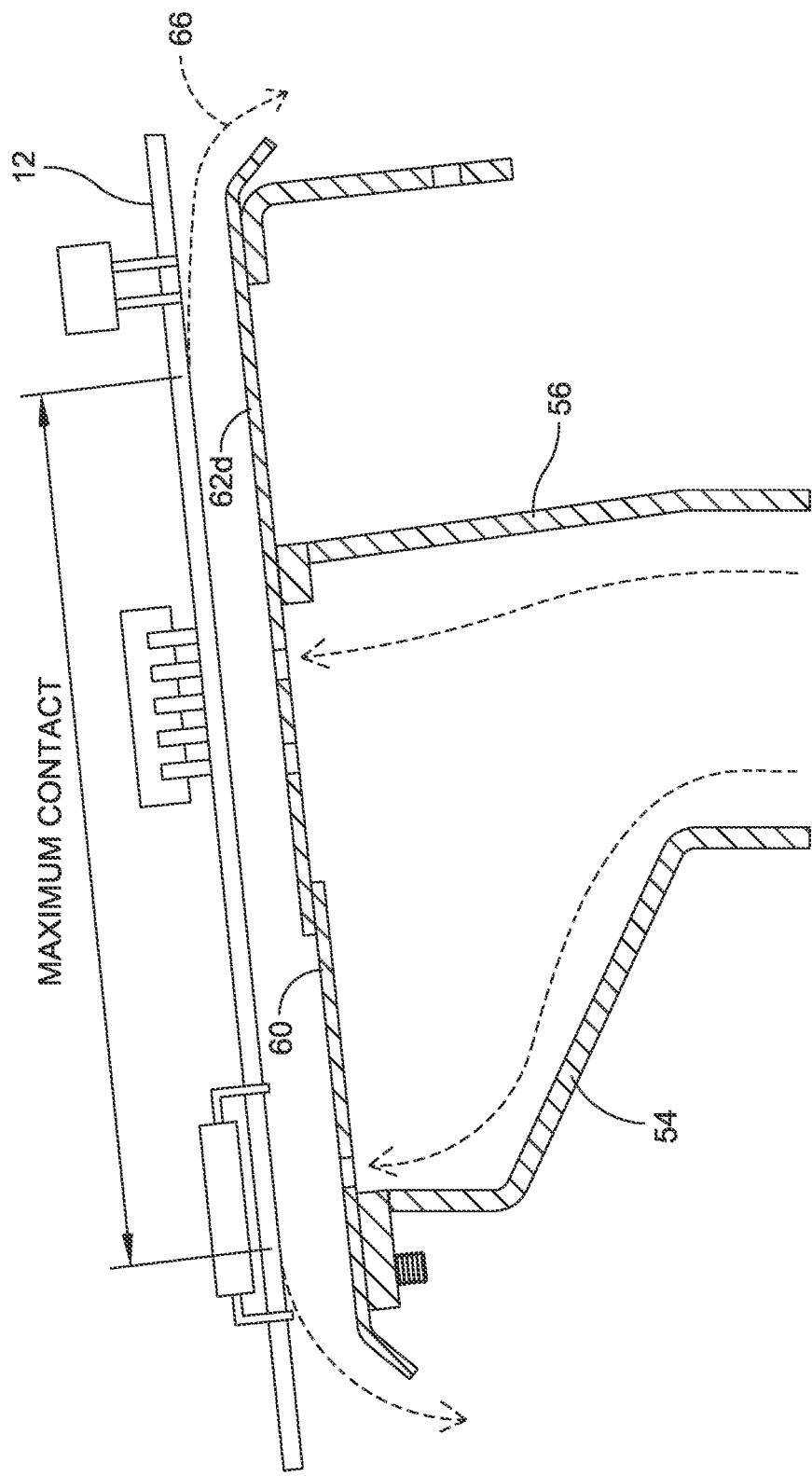
FIG. 11 is a cross-sectional view of the portion of the wave soldering nozzle assembly showing the plate of the wave soldering nozzle assembly in an open position.

FIG. 11 illustrates a solder nozzle plate, e.g., solder nozzle plate 62b and/or solder nozzle plate 62d (shown), in a second partially extended position so that the solder nozzle plate barely overlap the solder distribution baffle to allow full flow of molten solder through the nozzle. As shown, the flow of molten solder is capable of fully passing through the solder distribution baffle 60 and the solder nozzle plate 62d. The printed circuit board 12 passing over a solder wave 66 has maximum contact with the solder wave 66.

The result is that the solder wave can be controlled by opening and closing the solder nozzle plates 62a, 62b, 62c, 62d. For example, the solder wave can be controlled so that the wave extends through the solder distribution baffle 60 at a middle of the solder distribution baffle by closing solder nozzle plates 62a, 62d and opening solder nozzle plates 62b, 62c. With this set up, dross is reduced since the width of the solder wave is significantly reduced.

Flow Throttle Design

Figure 12:
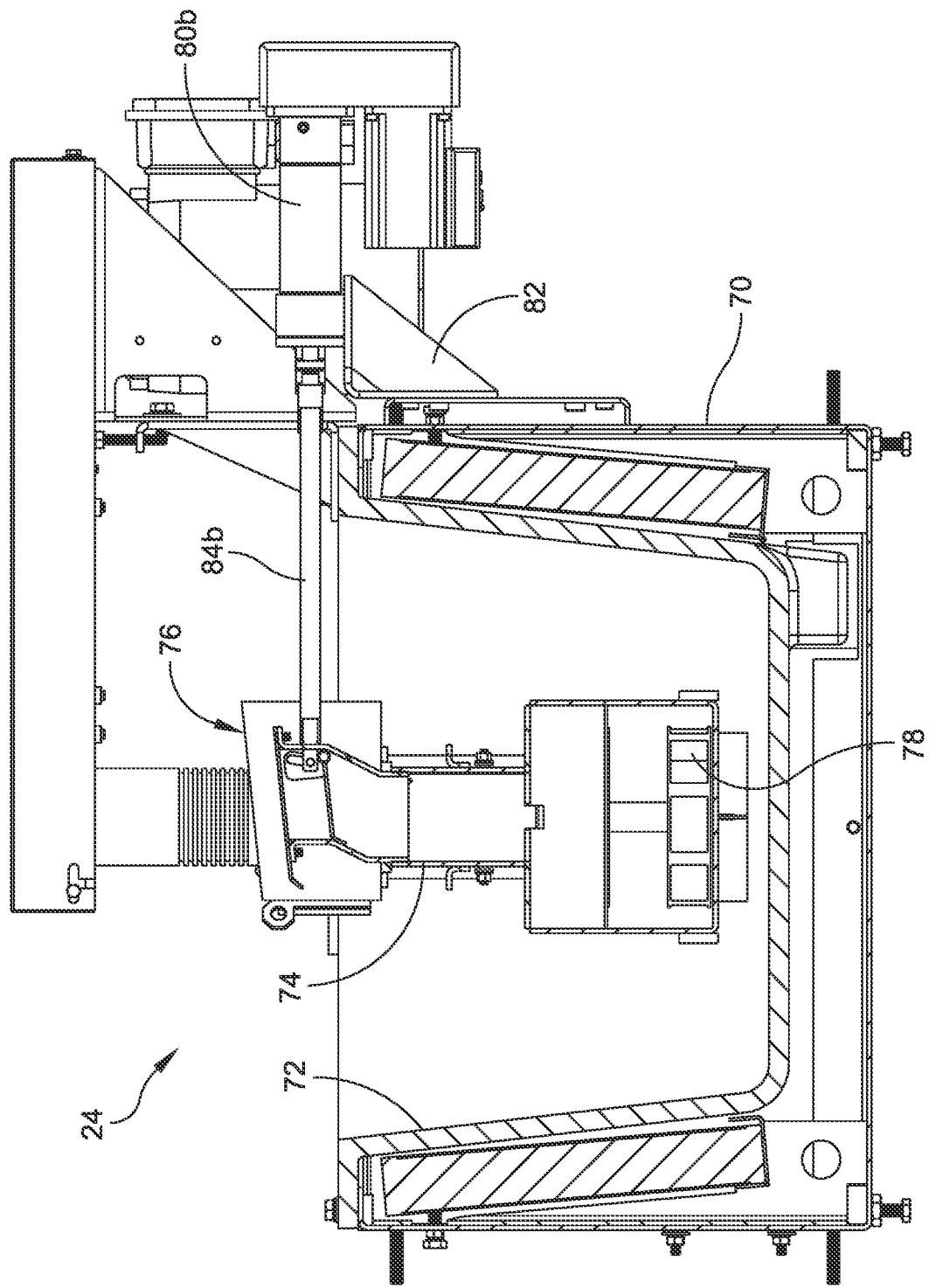
FIG. 12 is a cross-sectional view of a wave soldering station of another embodiment of the present disclosure.
Figure 13:
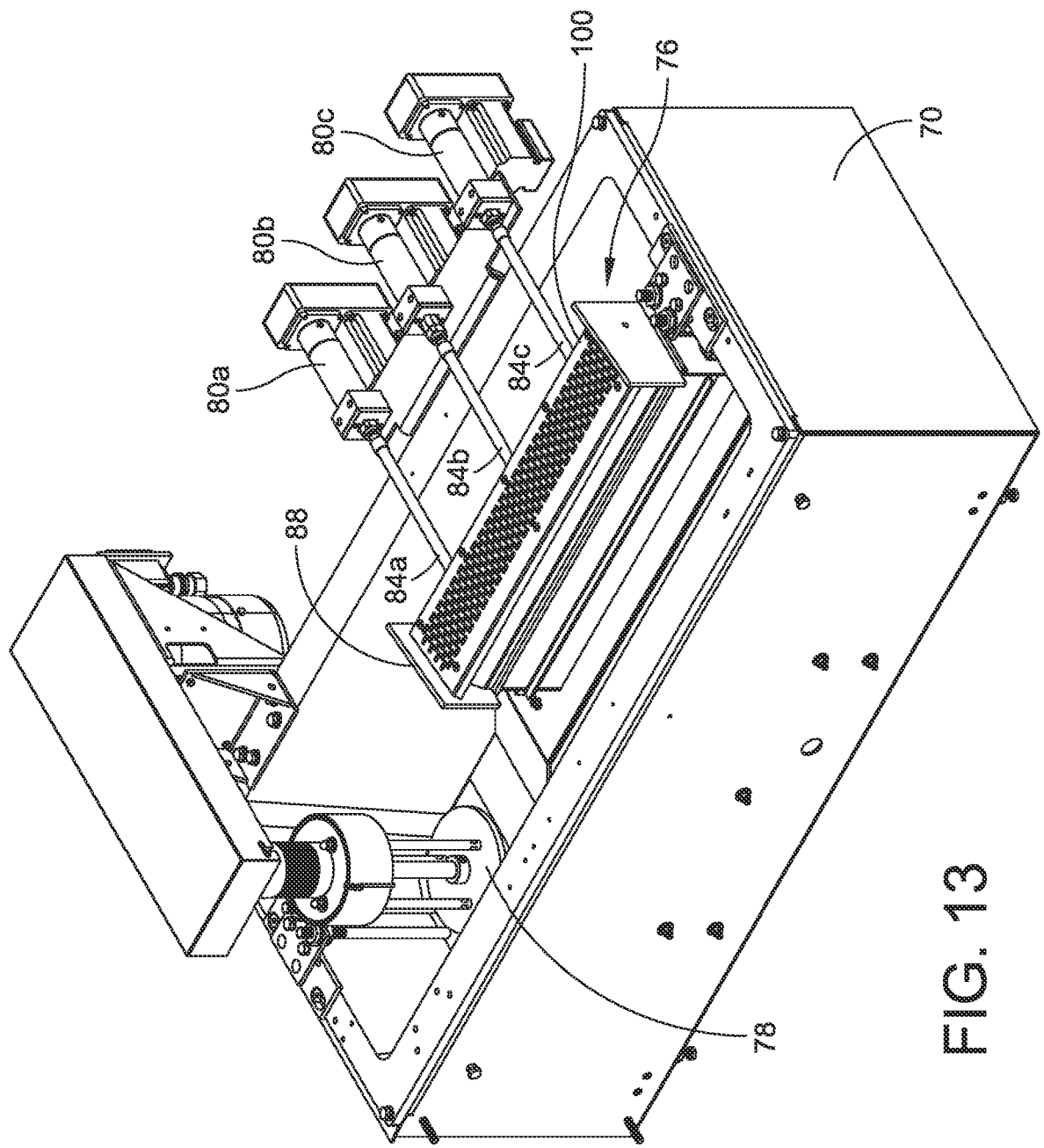
FIG. 13 is a perspective view of the wave soldering station.

Referring to FIGS. 12 and 13, in another embodiment, the wave soldering station 24 includes a solder pot 70 that defines a reservoir 72 configured to contain molten solder. In one embodiment, the solder pot 70 is a box-shaped structure that supports the components of the wave soldering station 24 including a flow duct 74 having one or more chambers within the reservoir 72. The flow duct 74 is designed to deliver pressurized molten solder to an opening or nozzle of a wave soldering nozzle assembly, which is generally indicated at 76. The wave soldering nozzle assembly 76 is configured to channel the molten solder to the bottom of the printed circuit board 12 and provides for smooth flow of solder back into the reservoir 72. Specifically, the wave soldering nozzle assembly 76 is capable of adjusting a height and a width of the solder wave when performing a wave soldering operation.

The wave soldering station 24 further includes a pump impeller 78 positioned within the reservoir 72 of the solder pot 70 adjacent an inlet provided in the flow duct 74. The pump impeller 78 pressurizes the molten solder in the reservoir 72 to pump the molten solder vertically within the reservoir to the wave soldering nozzle assembly 76. In one embodiment, the pump impeller 78 is a centrifugal pump that is suitably sized to pump the molten solder to the nozzle of the wave soldering nozzle assembly 76. The wave soldering nozzle assembly 76 is configured to generate a solder wave that is provided to attach components on the circuit board 12 in the manner described herein, and to optimize a dwell time during processing.

Figure 14:
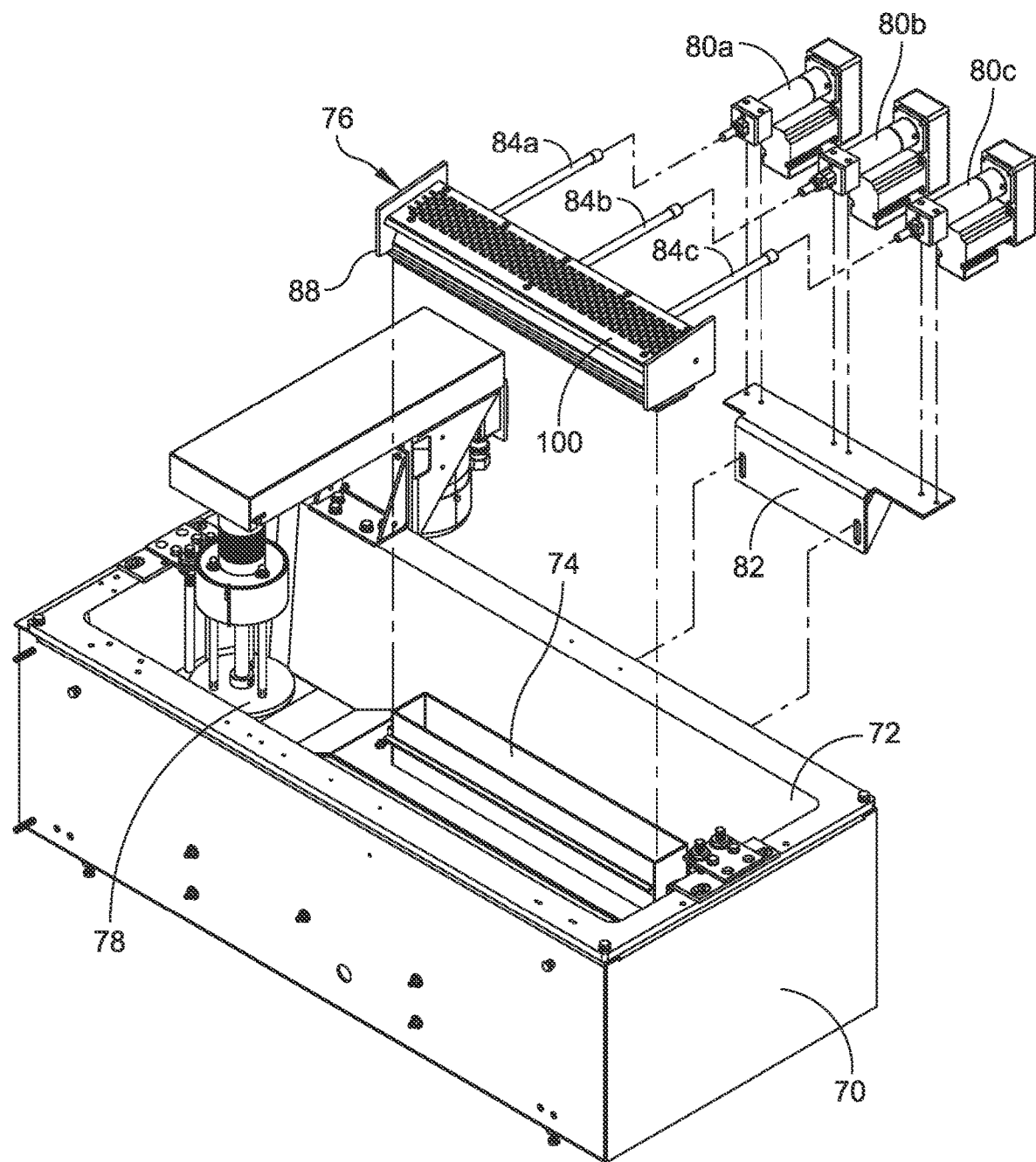
FIG. 14 is an exploded perspective view of the wave soldering station.
Figure 15:
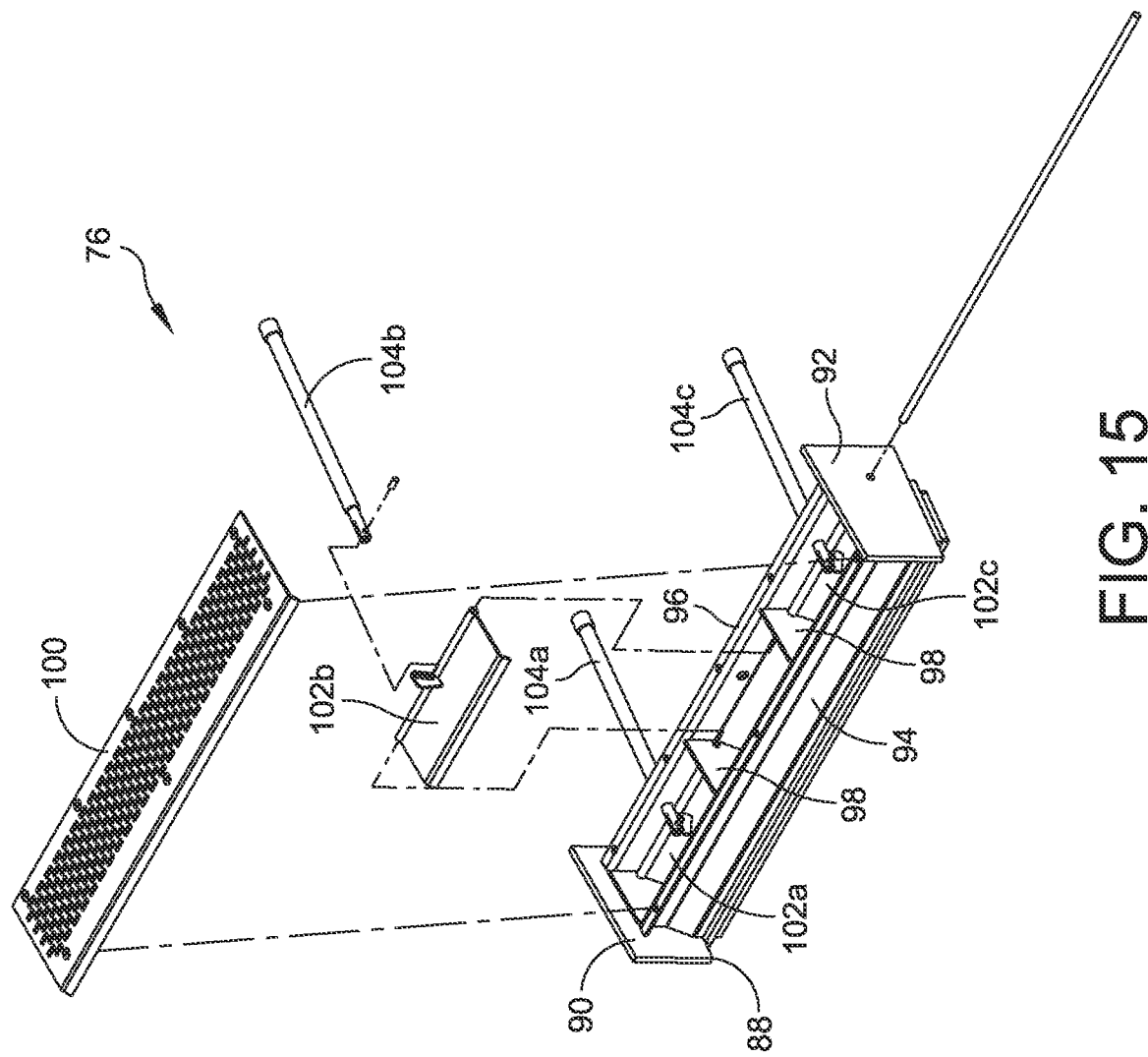
FIG. 15 is an exploded perspective view of a wave soldering nozzle assembly of the wave soldering station.

Referring additionally to FIGS. 14 and 15, the wave soldering nozzle assembly 76 is coupled to three actuators, actuators 80*a*, 80*b*, 80*c*, to cut off the flow of molten solder to portions of the wave soldering nozzle assembly. The actuators 80*a*, 80*b*, 80*c*, are secured to the solder pot 70 by an actuator support frame 82, which is secured to a side wall of the solder pot 70 by suitable fasteners, such as bolts. The actuator support frame 82 could alternately be secured to the solder pot 70 by another method, such as welding. As shown, the actuators 80*a*, 80*b*, 80*c*, are secured to the actuator support frame 82, which is configured to support the actuators firmly relative to the solder pot 70. The actuators 80*a*, 80*b*, 80*c*, are positioned next to the wave soldering nozzle assembly 76 and form part of the assembly to adjust the nozzle of the wave soldering nozzle assembly by respective connecting links 84*a*, 84*b*, 84*c*, which are coupled to their respective actuators. In certain embodiments, each actuator 80*a*, 80*b*, 80*c* includes an electromechanical actuator that provides movement for the adjustment of the nozzle opening width. The actuators 80*a*, 80*b*, 80*c* are driven by computer controlled machine software (supported by the controller 26) and incorporate an encoder that can relay position indication to the machine software.

The wave soldering nozzle assembly 76 includes a nozzle core frame 88 having two end walls 90, 92, a first longitudinal support element 94 and a second longitudinal support element 96 that extends between the end walls. As shown, the nozzle core frame 88 further may include several cross support elements, each indicated at 98, that extend between the first longitudinal support element 94 and the second longitudinal support element 96. The nozzle core frame 88 also directs the solder flow through a nozzle throat defined between the first and second longitudinal support elements 94, 96. The wave soldering nozzle assembly 76 further includes an elongate solder distribution baffle 100 that is secured to the first longitudinal support element 94 and the second longitudinal support element 96 of the nozzle core frame 88. The solder distribution baffle 100 is secured to the first longitudinal support element 94 and the second longitudinal support element 96 with screws through openings provided along sides of the solder distribution baffle. In one embodiment, the solder distribution baffle 100 includes a unique pattern of elongate openings to enable molten solder to flow through the baffle.

The wave soldering nozzle assembly further includes three solid solder nozzle plates 102*a*, 102*b*, 102*c*, which are secured to respective links 84*a*, 84*b*, 84*c* and a moved by respective actuators 80*a*, 80*b*, 80*c*. Each solder nozzle plate 102*a*, 102*b*, 102*c* is solid in construction and configured to block the flow of molten solder when extended under the solder distribution baffle 100. As shown, each solder nozzle plate 102*a*, 102*b*, 102*c* is moved by its respective actuator 80*a*, 80*b*, 80*c* to block or otherwise prohibit the flow of molten solder through the solder distribution baffle 100.

Figure 16:
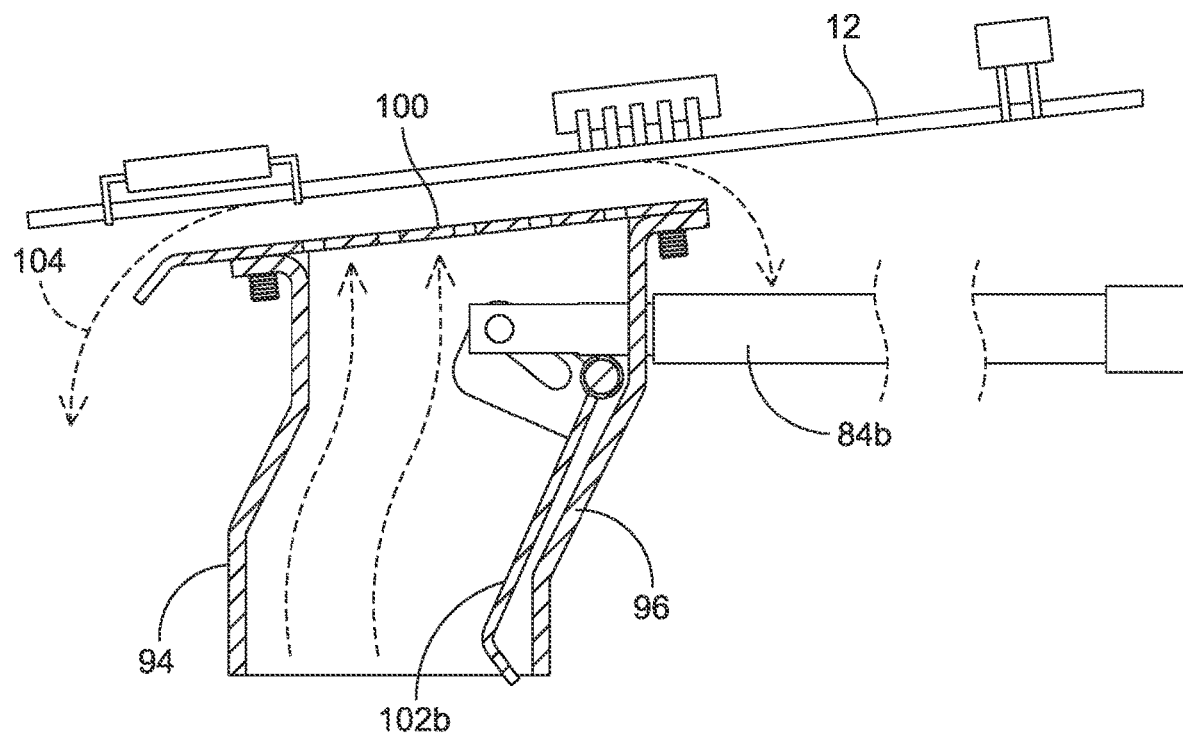
FIG. 16 is a cross-sectional view of a portion of the wave soldering nozzle assembly showing a plate of the wave soldering nozzle assembly in an open position.

Referring to FIG. 16, the solder nozzle plate, e.g., solder nozzle plate 102*b*, is hingedly attached to the second longitudinal support element 96 of the wave soldering nozzle assembly 76. As shown, the solder nozzle plate 102*b* is in an open position in which the solder nozzle plate 102*b* is positioned against the second longitudinal support element 96 of the wave soldering nozzle assembly 76. Specifically, the link, e.g., link 84*b*, is pivotally secured to the solder nozzle plate 102, and when the actuator is extended, e.g., actuator 80*b*, the link 84*b* positions the solder nozzle plate 102*b* in an open position. In the open position, molten solder is able to freely flow through the solder distribution baffle 100 to create solder wave 104.

Figure 17:
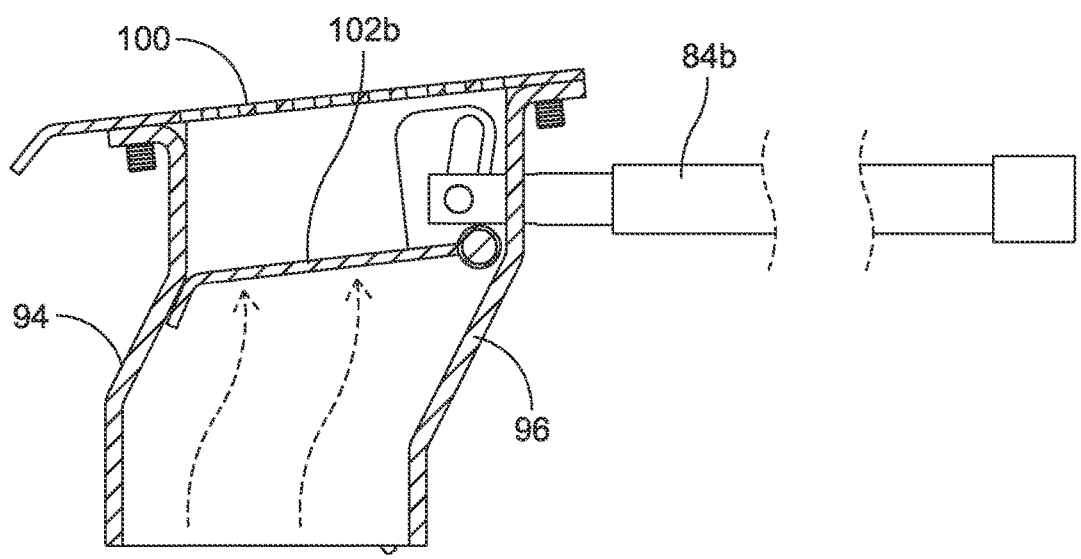
FIG. 17 is a cross-sectional view of the portion of the wave soldering nozzle assembly showing the plate of the wave soldering nozzle assembly in a closed position.

Referring to FIG. 17, the actuator 80*b* is retracted, thereby retracting the link 84*b* and moving the solder nozzle plate 102*b* to a closed position in which the solder nozzle plate 102*b* extends to the first longitudinal support element 94 of the wave soldering nozzle assembly 76. As shown, the solder nozzle plate 102*b* is positioned adjacent to the solder distribution baffle 100. In this position, molten solder is blocked or otherwise prohibited from flowing through the solder distribution baffle 100.

The result is that the solder wave can be controlled by opening and closing the solder nozzle plates 102*a*, 102*b*, 102*c*. For example, the solder wave can be controlled so that the wave extends through the solder distribution baffle 100 at a middle of the solder distribution baffle by closing solder nozzle plates 102*a*, 102*c* and opening solder nozzle plate 102*b*. With this set up, dross is reduced since the width of the solder wave is significantly reduced. The nozzle plates 102*a*, 102*b*, 102*c* can be manipulated by a respective actuator 80*a*, 80*b*, 80*c* to achieve a partially open position to reduce a height of the solder wave over the solder distribution baffle 100.

Solder Pump Control Design

Figure 18:
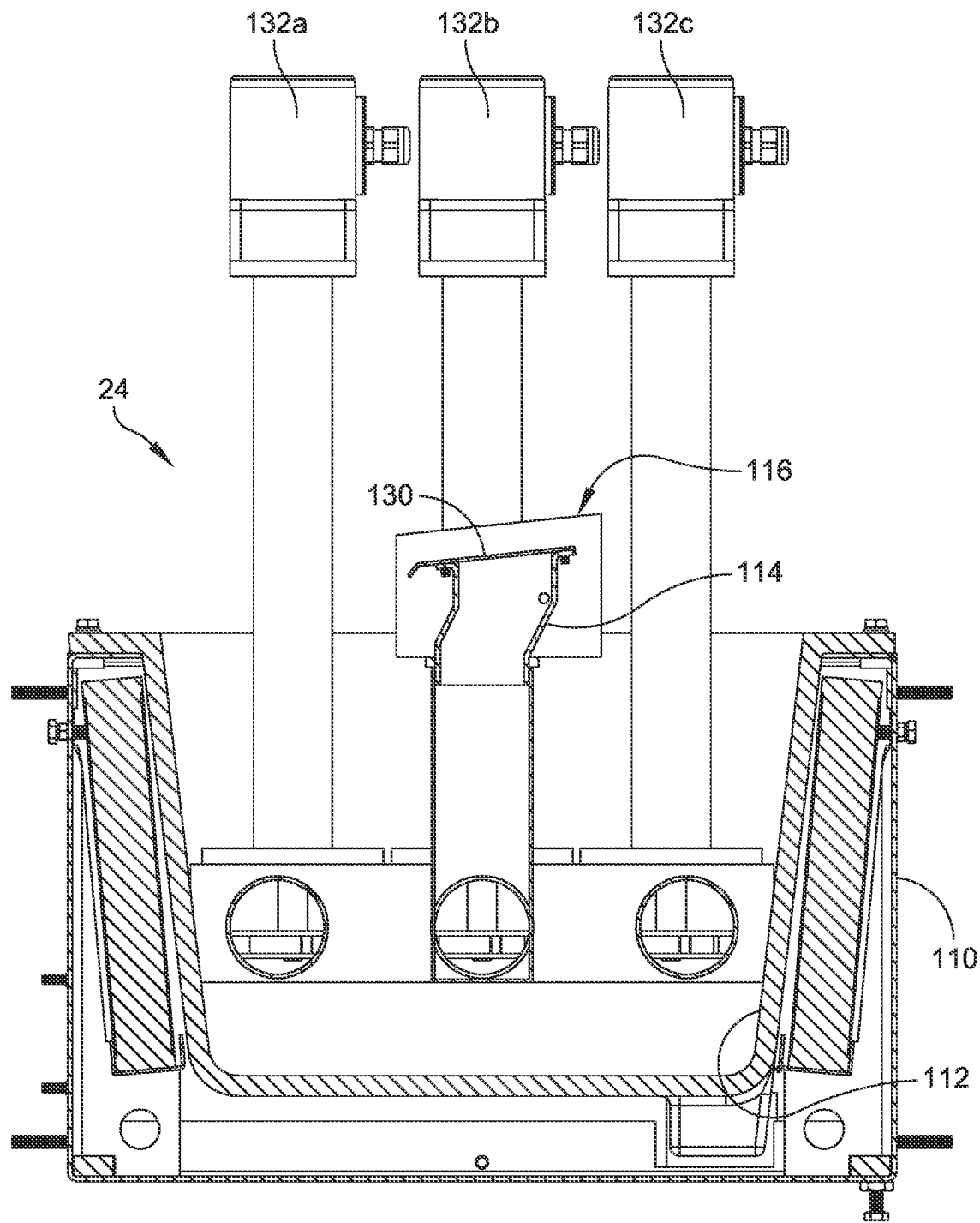
FIG. 18 is a cross-sectional view of a wave soldering station of another embodiment of the present disclosure.
Figure 19:
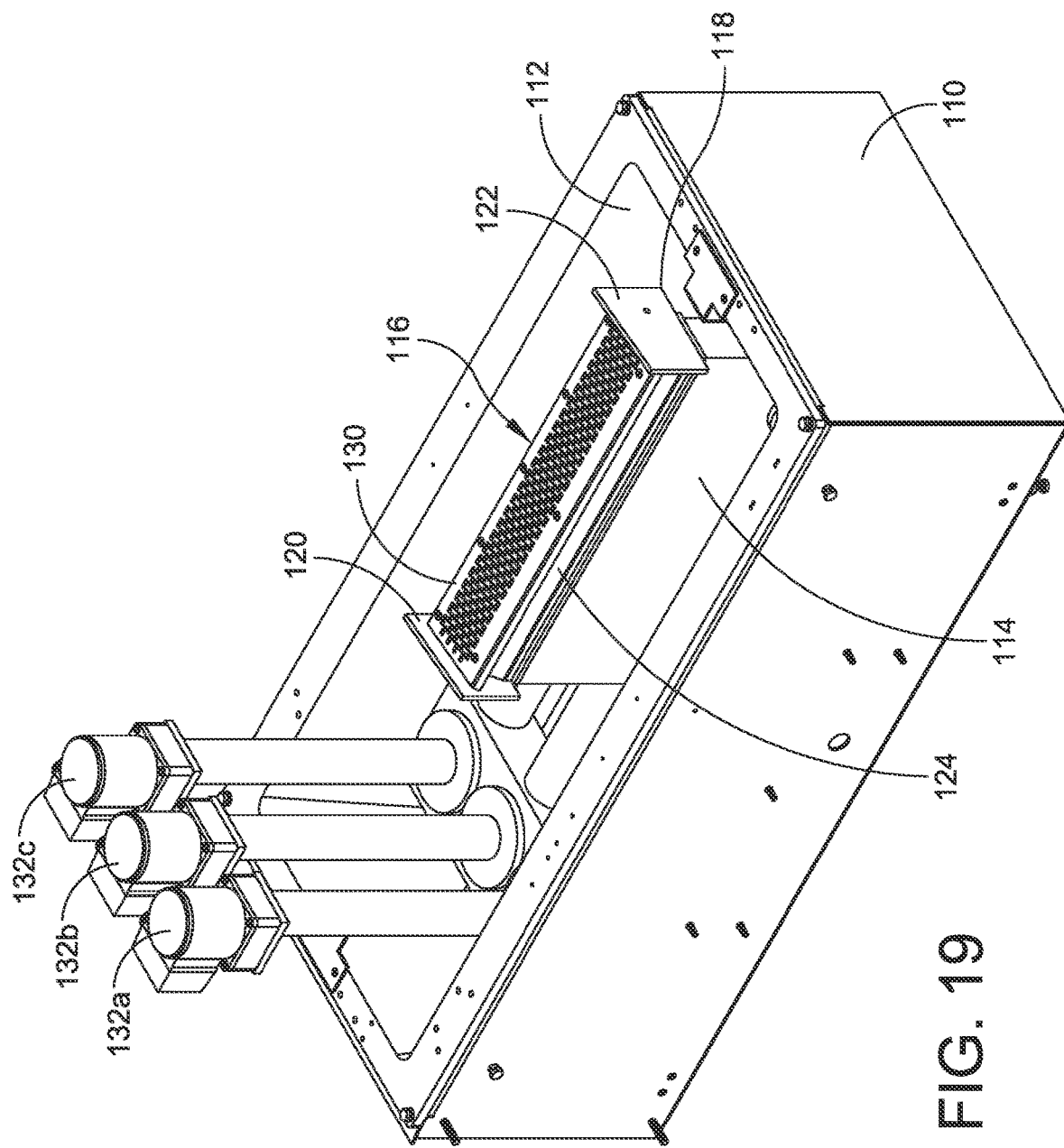
FIG. 19 is a perspective view of the wave soldering station.

Referring to FIGS. 18 and 19, in another embodiment, the wave soldering station 24 includes a solder pot 110 that defines a reservoir 112 configured to contain molten solder. In one embodiment, the solder pot 110 is a box-shaped structure that supports the components of the wave soldering station 24 including a flow duct 114 having three chambers within the reservoir 112. The flow duct 114 is designed to deliver pressurized molten solder to an opening or nozzle of a wave soldering nozzle assembly, which is generally indicated at 116. The wave soldering nozzle assembly 116 is configured to channel the molten solder to the bottom of the printed circuit board 12 and provides for smooth flow of solder back into the reservoir 112. Specifically, the wave soldering nozzle assembly 116 is capable of adjusting a height and a width of the solder wave when performing a wave soldering operation.

Figure 20:
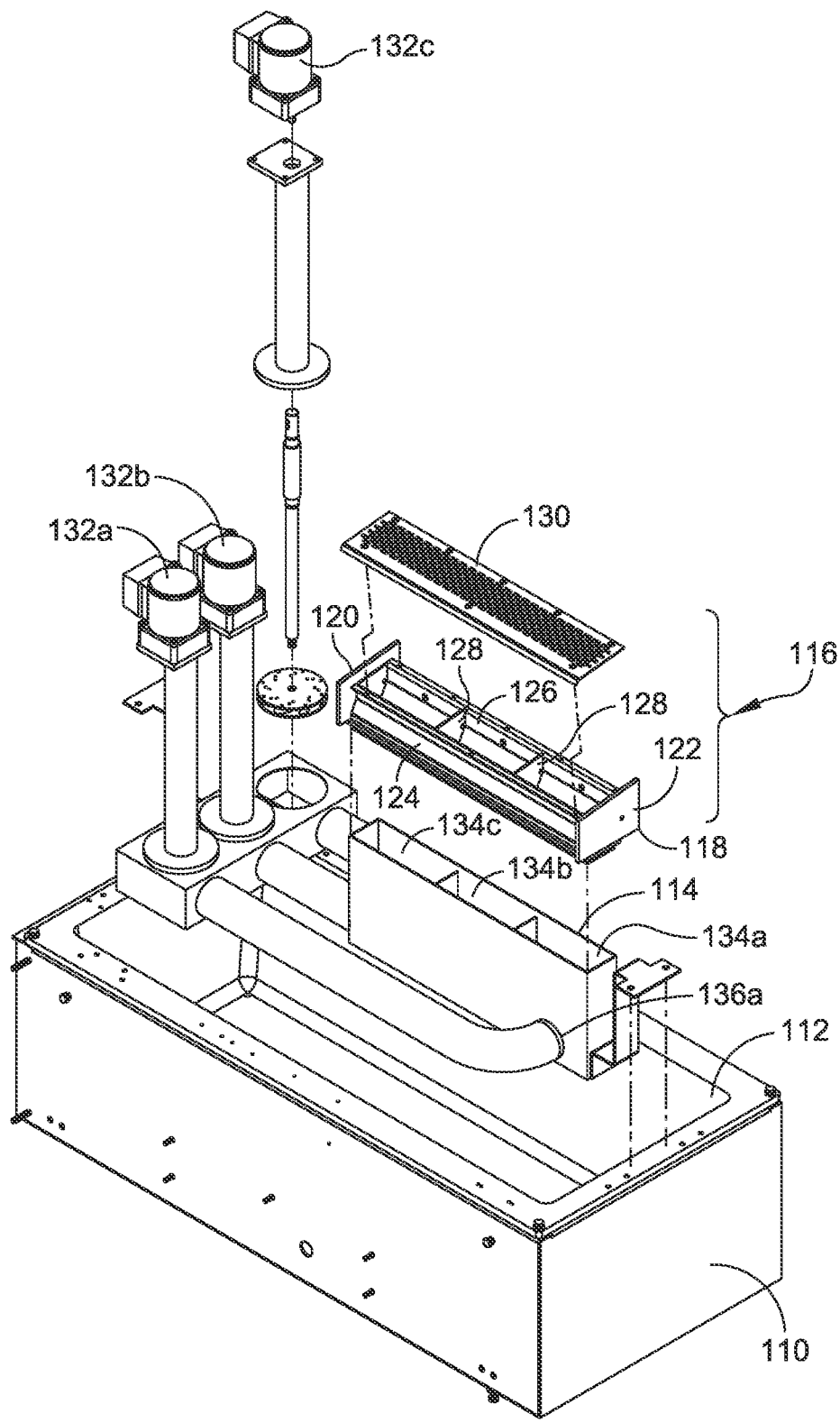
FIG. 20 is an exploded perspective view of the wave soldering station.

Referring additionally to FIG. 20, the wave soldering nozzle assembly 116 includes a nozzle core frame 118 having two end walls 120, 122, a first longitudinal support element 124 and a second longitudinal support element 126 that extends between the end walls. As shown, the nozzle core frame 118 further may include several cross support elements, each indicated at 128, that extend between the first longitudinal support element 124 and the second longitudinal support element 126. The nozzle core frame 118 also directs the solder flow through a nozzle throat defined between the first and second longitudinal support elements 124, 126. The wave soldering nozzle assembly 116 further includes an elongate solder distribution baffle 130 that is secured to the first longitudinal support element 124 and the second longitudinal support element 126 of the nozzle core frame 118. The solder distribution baffle 130 is secured to the first longitudinal support element 124 and the second longitudinal support element 126 with screws through openings provided along sides of the solder distribution baffle. In one embodiment, the solder distribution baffle 130 includes a unique pattern of elongate openings to enable molten solder to flow through the baffle.

The wave soldering station 24 further includes three pump impellers 132a, 132b, 132c, which are positioned within the reservoir 112 of the solder pot 110 adjacent to the flow duct 114. The pump impellers 132a, 132b, 132c pressurizes the molten solder in the reservoir 112 to pump the molten solder vertically within the reservoir to the flow duct 114 and the wave soldering nozzle assembly 116. In one embodiment, each pump impeller 132a, 132b, 132c is a centrifugal pump that is suitably sized to pump the molten solder to the nozzle of the wave soldering nozzle assembly 116. The wave soldering nozzle assembly 116 is configured to generate a solder wave that is provided to attach components on the circuit board 12 in the manner described below, and to optimize a dwell time during processing.

Figure 21:
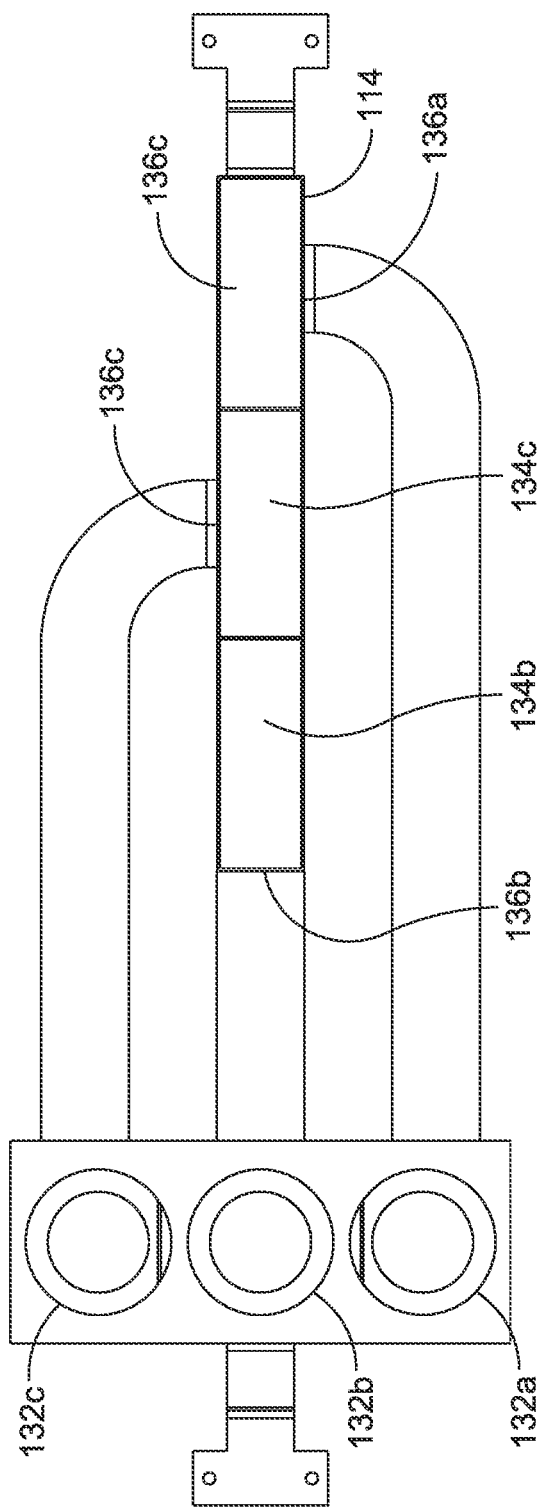
FIG. 21 is a top plan view of a portion of a wave soldering nozzle assembly of the wave soldering station.
Figure 22:
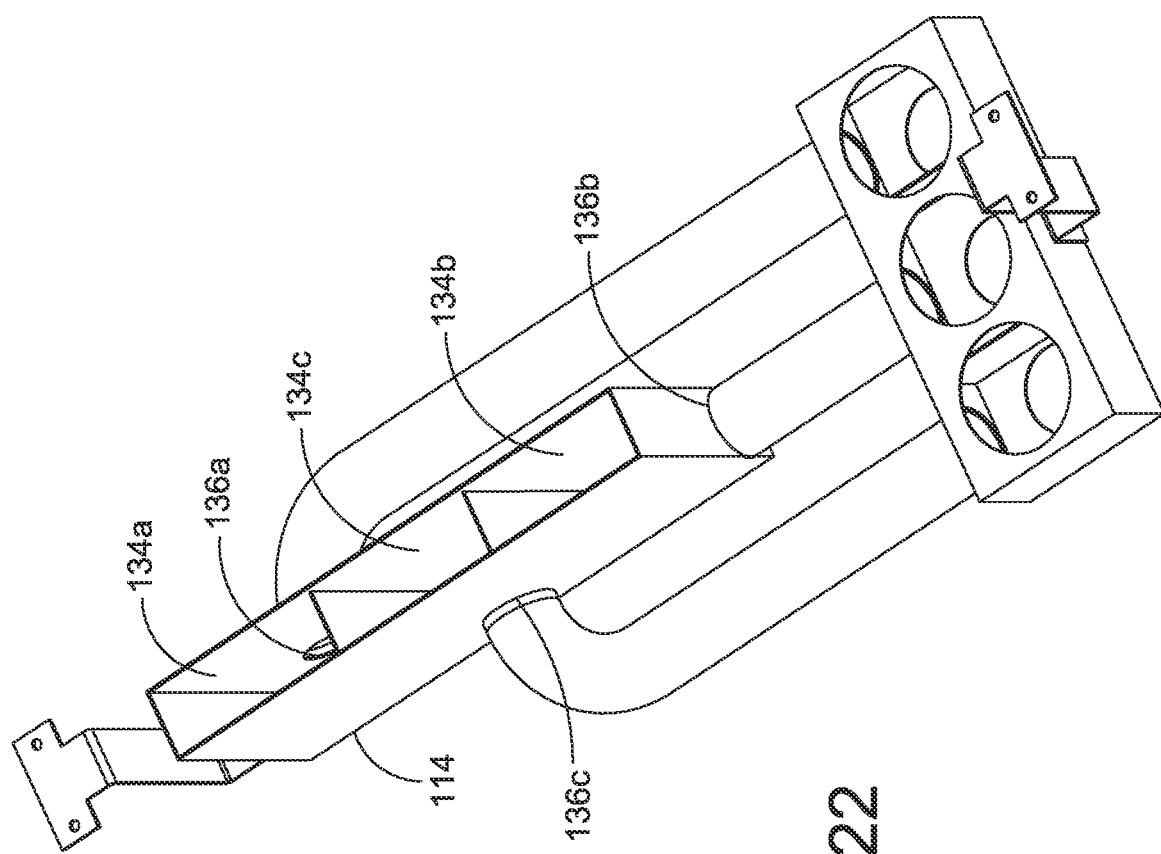
FIG. 22 is a perspective view of the portion of the wave soldering nozzle assembly of the wave soldering station.

Referring additionally to FIGS. 21 and 22, the flow duct includes three chambers 134a, 134b, 134c, each chamber including an inlet 136a, 136b, 136c, which are connected to a respective pump impeller. In the shown example, pump impeller 132a is connected chamber 134a by inlet 136a, pump impeller 132b is connected to chamber 134b by inlet 136b, and pump 132c is connected to chamber 134c by inlet 136c. Thus, flow of molten solder to the solder distribution baffle 130 is controlled by controlling the pump impellers 132a, 132b, 132c. The flow of molten solder through the chambers 134a, 134b, 134c can be independently controlled by controlling the pump impellers 132a, 132b, 132c.

The result is that the solder wave can be controlled by operating the pump impellers 132a, 132b, 132c. For example, the solder wave can be controlled so that the wave extends through the solder distribution baffle 130 at a middle of the solder distribution baffle by shutting off pump impellers 132a, 132b and operating pump impeller 132c. With this set up, dross is reduced since the width of the solder wave is significantly reduced.

Various controllers may execute various operations discussed above. For example, as discussed above, the controller, such as controller 26, may control the components of the wave soldering machine 10 including the wave soldering station 24, amongst other operations. Using data stored in associated memory and/or storage, the controller may execute one or more instructions stored on one or more non-transitory computer-readable media, which the controller may include and/or be coupled to, that may result in manipulated data. In some examples, the controller may include one or more processors or other types of controllers. In one example, the controller is or includes at least one processor. In another example, the controller performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

With each embodiment, solder flow through the nozzle can be controlled to reduce and even prevent dross recirculation through the nozzle. By reducing the width of the solder wave, dross is reduced. Each embodiment enables the width of the solder wave to be reduced.

In some embodiments, the wave soldering nozzle assembly further includes a dross box that is secured to the nozzle frame and configured to reduce turbulence as the solder travels back to the reservoir, thereby further reducing solder balls that can form within the reservoir.

In some embodiments, one or more nitrogen tubes can be provided to create an inert atmosphere during the wave soldering process.

In some embodiments, the minimum and the maximum contact can be varied.

As used herein, "solder wave width" describes a cross-sectional dimension of the actual solder wave and "contact length" describes a distance on a PCB that is in contact with the wave at any given point in time. The word "length" as used herein references contact length that is parallel to the direction of travel of the PCB.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A wave soldering machine to perform a wave soldering operation on a printed circuit board, the wave soldering machine comprising:
 a housing;
 a conveyor coupled to the housing, the conveyor being configured to deliver a printed circuit board through the housing; and
 a wave soldering station coupled to the housing, the wave soldering station including a solder pot having a reservoir of solder material, a flow duct positioned in the reservoir of the solder pot, and a wave soldering nozzle assembly coupled to the flow duct, the wave soldering nozzle assembly having a solder distribution baffle configured to create a solder wave, a core frame supported by the flow duct and configured to support the solder distribution baffle, and four nozzle plates provided along a width of the solder distribution baffle, each nozzle plate being configured to move with respect to the solder distribution baffle between an open position in which solder material flows through the solder distribution baffle and the nozzle plate and a closed position in which solder material is prohibited from flowing through the solder distribution baffle and the nozzle plate,
 wherein the wave soldering nozzle assembly is configured to selectively deliver solder material to portions of the solder distribution baffle to produce a solder wave having a desired width.

2. The wave soldering machine of claim 1, wherein the wave soldering nozzle assembly further includes, for each nozzle plate, an actuator configured to move the nozzle plate between the open position and the closed position.

3. The wave soldering machine of claim 2, wherein the wave soldering nozzle assembly further includes, for each nozzle plate, a link configured to secure the actuator to the nozzle plate.

4. The wave soldering machine of claim 2, wherein the actuator is coupled to a controller to control the movement of the actuator.

5. The wave soldering machine of claim 1, wherein the solder distribution baffle and each nozzle plate each includes a pattern of openings to enable solder material to pass through the solder distribution baffle and the nozzle plate.

6. A wave soldering machine to perform a wave soldering operation on a printed circuit board, the wave soldering machine comprising:
a housing;
a conveyor coupled to the housing, the conveyor being configured to deliver a printed circuit board through the housing; and
a wave soldering station coupled to the housing, the wave soldering station including a solder pot having a reservoir of solder material, a flow duct positioned in the reservoir of the solder pot, and a wave soldering nozzle assembly coupled to the flow duct, the wave soldering nozzle assembly having a solder distribution baffle configured to create a solder wave and a core frame supported by the flow duct and configured to support the solder distribution baffle,
wherein the wave soldering nozzle assembly further includes three nozzle plates provided along a width of the solder distribution baffle, each nozzle plate being configured to rotate with respect to the solder distribution baffle between an open position in which solder material flows through the solder distribution baffle and the nozzle plate and a closed position in which solder material is prohibited from flowing through the solder distribution baffle and the nozzle plate.

7. The wave soldering machine of claim 6, wherein the wave soldering nozzle assembly further includes, for each nozzle plate, an actuator configured to rotate the nozzle plate between the open position and the closed position.

8. The wave soldering machine of claim 7, wherein the wave soldering nozzle assembly further includes, for each nozzle plate, a link configured to secure the actuator to the nozzle plate and configured to rotate the nozzle plate between the open position and the closed position.

9. The wave soldering machine of claim 7, wherein the actuator is coupled to a controller to control the movement of the actuator.

10. The wave soldering machine of claim 7, wherein the solder distribution baffle includes a pattern of openings to enable solder material to pass through the solder distribution baffle.

11. The wave soldering machine of claim 1, wherein the wave soldering station further includes three pump impellers positioned within the reservoir the solder pot adjacent the flow duct, and wherein the flow duct includes three chambers, each pump impeller being in fluid communication with a respective chamber, the flow of solder material within each chamber of the three chambers being controlled by a respective pump impeller of the three pump impellers.

12. The wave soldering machine of claim 11, wherein each pump impeller of the three pump impellers includes a centrifugal pump to pump the solder material to the wave soldering nozzle assembly.

13. The wave soldering machine of claim 11, wherein each chamber of the three chambers includes an inlet, which is connected to a respective pump impeller.

14. The wave soldering machine of claim 11, wherein each pump impeller of the three pump impellers is coupled to a controller to control the flow of solder material provided by the pump impeller.

15. A method of producing a solder wave having a desired width, the method comprises:
delivering solder material to a wave soldering nozzle assembly including a solder distribution baffle;
selectively delivering solder material to portions of the solder distribution baffle to produce a solder wave having a desired width;
performing a wave soldering operation on a printed circuit board; and
selectively delivering solder material to portions of the solder distribution baffle by moving a nozzle plate of four nozzle plates, each nozzle plate being configured to move with respect to the solder distribution baffle between an open position in which solder material flows through the solder distribution baffle and the nozzle plate and a closed position in which solder material is prohibited from flowing through the solder distribution baffle and the nozzle plate.

16. A method of producing a solder wave having a desired width, the method comprises:
delivering solder material to a wave soldering nozzle assembly including a solder distribution baffle;
selectively delivering solder material to portions of the solder distribution baffle to produce a solder wave having a desired width;
performing a wave soldering operation on a printed circuit board; and
selectively delivering solder material to portions of the solder distribution baffle by rotating a nozzle plate of three nozzle plates, each nozzle plate being configured to rotate with respect to the solder distribution baffle between an open position in which solder material flows through the solder distribution baffle and the nozzle plate and a closed position in which solder material is prohibited from flowing through the solder distribution baffle and the nozzle plate.

17. The method of claim 15, further comprising selectively delivering solder material to portions of the solder distribution baffle by selectively controlling three pump impellers positioned within a reservoir a solder pot and in fluid communication with a respective chamber along a width of the solder distribution baffle.

* * * * *